(12) United States Patent
Hashimoto

(10) Patent No.: US 9,595,811 B2
(45) Date of Patent: Mar. 14, 2017

(54) QUANTUM CASCADE SEMICONDUCTOR LASER

(71) Applicant: SUMITOMO ELECTRIC INDUSTRIES, LTD., Osaka (JP)

(72) Inventor: Jun-ichi Hashimoto, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/088,600

(22) Filed: Apr. 1, 2016

(65) Prior Publication Data

US 2016/0294160 A1    Oct. 6, 2016

(30) Foreign Application Priority Data

Apr. 3, 2015 (JP) ................. 2015-076965

(51) Int. Cl.
*H01S 5/22* (2006.01)
*H01S 5/227* (2006.01)
*H01S 5/34* (2006.01)

(52) U.S. Cl.
CPC ............ *H01S 5/227* (2013.01); *H01S 5/3402* (2013.01)

(58) Field of Classification Search
CPC ....... H01S 5/227; H01S 5/3402; H01S 5/3401
See application file for complete search history.

(56) References Cited

FOREIGN PATENT DOCUMENTS

JP    2003-526214    9/2003

OTHER PUBLICATIONS

S. Golka et al., "GaAs/AlGaAs Quantum Cascade Lasers With Dry Etched Semiconductor-Air Bragg Reflectors", Journal of Modern Optics, vol. 52, No. 16. pp. 2303-2308, 2005.

*Primary Examiner* — Armando Rodriguez
(74) *Attorney, Agent, or Firm* — Smith, Gambrell & Russell, LLP.

(57) ABSTRACT

A quantum cascade semiconductor laser includes a substrate and a semiconductor region provided on a principal surface of the substrate, the semiconductor region including a mesa waveguide, a first burying region provided on a first side surface of the mesa waveguide, and a second burying region provided on a second side surface of the mesa waveguide. Each of the first and second burying regions includes a plurality of laminate regions and a plurality of bulk semiconductor regions that are alternately arrayed. The laminate regions are separated from each other by the bulk semiconductor regions. The bulk semiconductor regions are provided on side surfaces of the laminate regions so as to embed the laminate regions. Each of the laminate regions includes a semiconductor laminate structure having a plurality of semiconductor layers.

13 Claims, 12 Drawing Sheets

QUANTUM CASCADE SEMICONDUCTOR LASER

BACKGROUND OF THE INVENTION

Field of the Invention

The present invention relates to a quantum cascade semiconductor laser.

Related Background Art

Japanese Patent Laid Open No. 2003-526214 Publication discloses a quantum cascade semiconductor laser.

SUMMARY OF THE INVENTION

A buried heterostructure (BH) is one of structures for quantum cascade lasers, and includes a mesa waveguide. A quantum cascade semiconductor laser operates to emit an optical beam in a mid-infrared wavelength region, and the optical beam with a long lasing wavelength propagates with wide distribution not only in a core layer but also in a cladding layer and a semiconductor substrate, which are outside of the core layer, in the quantum cascade semiconductor laser. What is needed for the quantum cascade semiconductor laser in order to confine such an optical beam is to form a high-mesa waveguide which includes a cladding layer and a part of a semiconductor substrate.

The mesa waveguide is formed by the following process: growing a semiconductor laminate on a substrate; and etching the semiconductor laminate with a mask for defining a mesa shape. This process requires that the semiconductor laminate be etched over a wide area on a principal surface of the substrate, whereas as a result of the etching, the mesa waveguide alone is left on the remaining portion of the principal surface of the substrate. Such an etching over a wide area results in difficulty in forming a high mesa desired for the quantum cascade semiconductor laser, and is one of the factors that makes fabrication of the quantum cascade semiconductor laser difficult.

In addition, a waveguide mesa of a quantum cascade semiconductor laser thus formed has a stripe-shaped semiconductor region that protrudes from a semiconductor surface formed by etching. The stripe-shaped semiconductor region lies around the center of each device section on the wafer and is apart from the boundary of the device section, and is buried by semiconductor for blocking current. In this regrowth, the semiconductor grows on both the semiconductor surface and the side surfaces of the stripe-shaped semiconductor region to be buried, so that the growth of a current blocking layer occurs at a high growth rate in the vicinity of the stripe-shaped semiconductor region, but contribution of the growth on the side surfaces of the stripe-shaped semiconductor region decreases with distance from the stripe-shaped semiconductor region outward along the semiconductor surface, so that the growth rate of the current blocking layer becomes small at distant places from the stripe-shaped semiconductor region. Such regrowth causes the current blocking layer, which is to bury the mesa waveguide, to have a profile in thickness that gradually decrease with distance in a direction from the stripe-shaped semiconductor region toward the device boundary, thereby making the thickness of the current blocking layer non-uniform in one device section. The non-uniformity of the thickness of the current blocking layer leads to the non-uniformity of flatness of a device surface of the quantum cascade semiconductor laser, which makes it difficult to mount the quantum cascade semiconductor laser in an epi-down manner.

The difficulty in forming a mesa waveguide due to the wide-range etching and the non-uniformity of the thickness of the current blocking layer that buries the mesa waveguide makes a difficulty in realizing a quantum cascade semiconductor laser high.

A quantum cascade semiconductor laser according to one aspect of the present invention includes: a substrate including a first region, a second region, and a third region that are arranged along a first axis, the third region being provided between the first region and the second region; and a semiconductor region provided on a principal surface of the substrate. The semiconductor region includes a mesa waveguide provided on the third region of the substrate, a first burying region provided on a first side surface of the mesa waveguide and the first region of the substrate, and a second burying region provided on a second side surface of the mesa waveguide and the second region of the substrate. Each of the first burying region and the second burying region includes a plurality of laminate regions and a plurality of bulk semiconductor regions that are alternately arrayed in the direction of the first axis. The laminate regions are separated from each other by the bulk semiconductor region. The bulk semiconductor regions are provided on side surfaces of the laminate regions so as to embed the laminate regions. In addition, each of the laminate regions includes a semiconductor laminate structure having a plurality of semiconductor layers.

The above and other objects, features, and advantages according to embodiments of the present invention will be more readily understood by reference to the following detailed description of a preferred embodiment of the present invention when taken in connection with the accompanying drawings.

DETAILED DESCRIPTION

Figure 1:
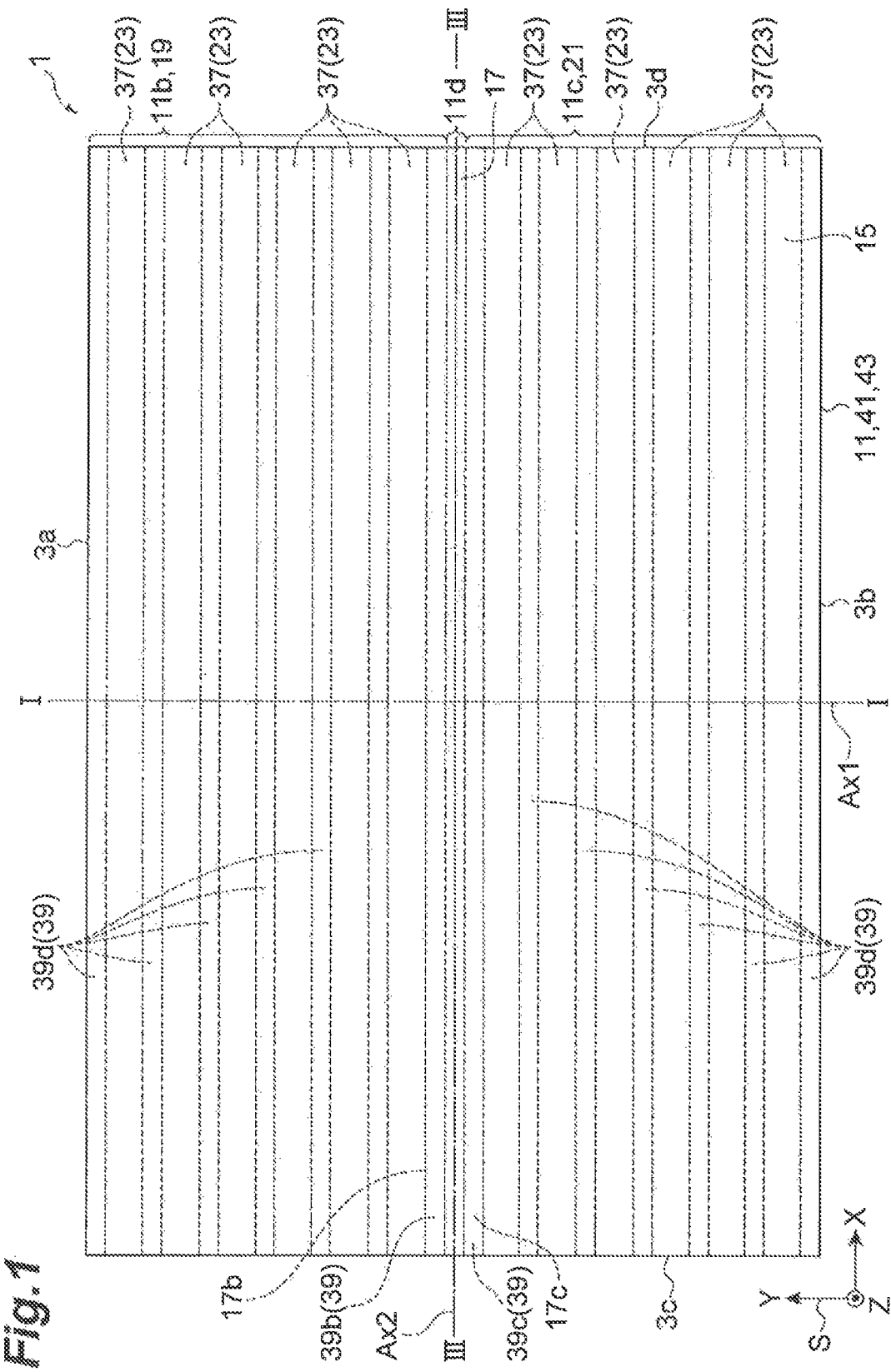
FIG. 1 is a schematic plan view showing a quantum cascade semiconductor laser according to the present embodiment.

Several embodiments will now be described.

A quantum cascade semiconductor laser according to an embodiment includes: a substrate including a first region, a second region, and a third region that are arranged along a first axis, the third region being provided between the first region and the second region; and a semiconductor region provided on a principal surface of the substrate. The semiconductor region includes a mesa waveguide provided on the third region of the substrate, a first burying region provided on a first side surface of the mesa waveguide and the first region of the substrate, and a second burying region provided on a second side surface of the mesa waveguide and the second region of the substrate. Each of the first burying region and the second burying region includes a plurality of laminate regions and a plurality of bulk semiconductor regions that are alternately arrayed in the direction of the first axis. The laminate regions are separated from each other by the bulk semiconductor region. The bulk semiconductor regions are provided on side surfaces of the laminate regions so as to embed the laminate regions. In addition, each of the laminate regions includes a semiconductor laminate structure having a plurality of semiconductor layers.

In addition, in the quantum cascade semiconductor laser according to an embodiment, the mesa waveguide may include a core layer and an upper cladding layer disposed on the core layer. The semiconductor laminate structure of the laminate region may include the core layer and the upper cladding layer.

In the above quantum cascade semiconductor laser, the first burying region and the second burying region include laminate regions, and the laminate regions are disposed in the first region and the second region. The laminate regions and the mesa waveguide both include semiconductor laminate structures having a plurality of semiconductor layers. Specifically, the semiconductor laminate structure includes a core layer and an upper cladding layer disposed on the core layer that are included in the mesa waveguide. These laminate regions each include the same semiconductor laminate structure as the mesa waveguide, and the laminate regions and the mesa waveguide constitute an arrangement of the semiconductor laminate structures that are separated from each other. The bulk burying regions are provided between the laminate regions and the mesa waveguide that are separated from each other to electrically separate the mesa waveguide from each of the laminate regions. The arrangement of the laminate regions does not disturb the confinement of current into the mesa waveguide.

In the etching to form the mesa waveguide, the laminate regions can be formed along with the mesa waveguide. The introduction of the laminate regions can reduce the area of semiconductor to be etched per one device section on the wafer in the etching to form the mesa waveguide, and the reduction allows an etching rate in the formation of the mesa waveguide to increase. The application of the laminate regions to the first region and the second region makes it easy to form a high mesa waveguide by etching, which is desired in a quantum cascade laser. The addition of the laminate regions to the first region and the second region also allows the bulk semiconductor region to have favorable flatness in the first region and the second region.

In the quantum cascade semiconductor laser according to an embodiment, the core layer may include active layers for emitting light and injection layers for injecting a carrier into the active layers. The active layers and the injection layers are alternately stacked.

According to the quantum cascade semiconductor laser, a cascade connection of injection layers and active layers is applicable to the core layer of the quantum cascade semiconductor laser. Arraying the active layers with the injection layers being provided between the active layers allows electrons to continuously flow into a next-stage active layer in a seamless manner and electron transition to occur between sub-bands of the conduction band, thereby demonstrating favorable lasing in the quantum cascade semiconductor laser.

In the quantum cascade semiconductor laser according to an embodiment, the bulk semiconductor region may include at least one of semi-insulating semiconductor or undoped semiconductor.

These highly resistive materials in the quantum cascade semiconductor laser enable the bulk semiconductor region to favorably function as a current blocking layer for confining current (carriers) to the mesa waveguide. In addition, bulk semiconductor with a high resistivity, provided apart from the side surfaces of the mesa waveguide, can form high-resistive semiconductor regions outside the mesa waveguide, which reduce a leakage current flowing outside of the mesa waveguide.

In the quantum cascade semiconductor laser according to an embodiment, preferably, the bulk semiconductor region includes first bulk portions. The first bulk portions and the laminate regions are alternately arrayed in the direction of the first axis.

The quantum cascade semiconductor laser has an improved surface flatness, which makes it easy to mount the laser in an epi-down manner with heat dissipation being superior. This epi-down mounting can prevent performances of the quantum cascade semiconductor laser from being deteriorated because of heat dissipation failure. In addition, the etching rate can be increased in forming the mesa waveguide. The increased etching rate allows a high mesa, the formation difficulty of which has been an obstacle in the fabrication of quantum cascade semiconductor lasers, to be readily formed by etching.

In the quantum cascade semiconductor laser according to an embodiment, preferably, the bulk semiconductor region includes second bulk portions. The second bulk portions and the laminate regions are alternately arrayed in a direction of a second axis intersecting the first axis.

The quantum cascade semiconductor laser has an improved surface flatness, which makes it easy to mount the laser in an epi-down manner with heat dissipation being superior. This epi-down mounting can prevent performances of the quantum cascade semiconductor laser from being deteriorated because of heat dissipation failure. In addition, the etching rate can be increased in forming the mesa waveguide. The increased etching rate allows a high mesa, which has been an obstacle in the fabrication of quantum cascade semiconductor lasers, to be readily formed by etching. Furthermore, the quantum cascade semiconductor laser includes an end face (excluding an end face of the mesa waveguide) which is constituted by a high resistance bulk semiconductor region without containing aluminum (Al).

Accordingly, the quantum cascade semiconductor laser can prevent the end face from being subjected to Al oxidation and reduce a leakage current in the end face. The quantum cascade semiconductor laser can demonstrate the reduction or the avoidance in deterioration attributable to the oxidation or the leakage current associated with the end face.

The quantum cascade semiconductor laser according to an embodiment may further include an upper electrode provided on the semiconductor region, the upper electrode being in contact with a top surface of the mesa waveguide; and a dielectric insulating film provided between the upper electrode and the first and second burying regions.

The quantum cascade semiconductor laser includes the dielectric insulating film that has durability and an insulating property. In addition, the dielectric insulating film can be readily formed using a general reactor for dielectric film deposition and can be readily introduced into a manufacturing process.

In the quantum cascade semiconductor laser according to an embodiment, the dielectric insulating film may be made of at least one of $SiO_2$, SiON, SiN, alumina, BCB resin, or polyimide resin.

In the quantum cascade semiconductor laser, the dielectric insulating film is made of $SiO_2$, SiON, SiN, alumina, BCB resin, or polyimide resin that has superior durability and a superior insulating property. In addition, the dielectric insulating film including these materials can be readily formed with a general reactor for dielectric film deposition, which can be readily introduced into a manufacturing process.

The quantum cascade semiconductor laser according to an embodiment may further include an upper electrode provided on the semiconductor region, the upper electrode being in contact with a top surface of the mesa waveguide; and a semiconductor capping layer provided between the upper electrode and the first and second burying regions. The semiconductor capping layer includes at least one of an undoped semiconductor layer or a semi-insulating semiconductor layer.

The quantum cascade semiconductor laser may include the semiconductor capping layer of a semi-insulating semiconductor and/or an undoped semiconductor, which have favorable thermal conductivity and can further improve flatness of the device surface, as compared to a dielectric insulating film. The application of the semiconductor capping layer enables heat dissipation in the device to further increase in an epi-down manner, and can prevent characteristics of the quantum cascade semiconductor laser from being deteriorated because of heat dissipation failure.

In the quantum cascade semiconductor laser according to an embodiment, the semiconductor capping layer may include a semi-insulating semiconductor layer doped with a transition metal including at least one of Fe, Ti, Cr, or Co.

In the quantum cascade semiconductor laser, these transition metals allow III-V compound semiconductors, such as InP, GaInAs, AlInAs, GaInAsP, and AlGaInAs, to be provided with a semi-insulating property and to have sufficient high resistance to electrons, such as $10^5$ (Ω·cm) or higher. The addition of these transition metals is suitable for providing a high resistance material of the semiconductor capping layer.

In the quantum cascade semiconductor laser according to an embodiment, the bulk semiconductor region may include a semi-insulating semiconductor layer doped with transition metal including at least one of Fe, Ti, Cr, and Co.

In the quantum cascade semiconductor laser, these transition metals allow III-V compound semiconductors, such as InP, GaInAs, AlInAs, GaInAsP, and AlGaInAs, to be provided with a semi-insulating property and to have sufficient high resistance to electrons, such as $10^5$ (Ω·cm) or higher. The addition of these transition metals is suitable for providing a high resistance of the bulk semiconductor region.

In the quantum cascade semiconductor laser according to an embodiment, the upper cladding layer may be made of InP.

In the quantum cascade semiconductor laser, InP is transparent to mid-infrared lasing light, and is suitable as material of a cladding layer material. In addition, InP is a binary mixed crystal and a lattice thereof matches to that of an InP substrate, which allows InP to be readily grown. Furthermore, InP has favorable thermal conductivity, and the cladding layer of InP allows favorable dissipation of heat from a core layer therethrough. The InP cladding layer can provide the quantum cascade semiconductor laser with improved temperature characteristics.

In the quantum cascade semiconductor laser according to an embodiment, each of the active layers and the injection layers may be constituted by a GaInAs/AlInAs superlattice structure.

In the quantum cascade semiconductor laser, the superlattice structure is capable of providing an optical transition between the sub-bands of the conduction band, corresponding to a wavelength in a mid-infrared region, so that the superlattice structure is favorably used as a core layer for a mid-infrared quantum cascade semiconductor laser.

In the quantum cascade semiconductor laser according to an embodiment, the substrate may be made of an n-type InP.

According to the quantum cascade semiconductor laser, semiconductor layers constituting the quantum cascade semiconductor laser have respective lattice constants close to that of InP, and the application of an InP substrate enables the layers to be grown with favorable crystalline quality. In addition, the InP substrate is transparent to mid-infrared lasing light, so that it can be used as a lower cladding region.

The teachings of the present invention can be easily understood by referring to the below-described detailed description and accompanying exemplary drawings. Embodiments of a quantum cascade semiconductor laser and a method of fabricating the quantum cascade semiconductor laser will be described below. If possible, same portions will be denoted by same reference symbols.

Figure 2:
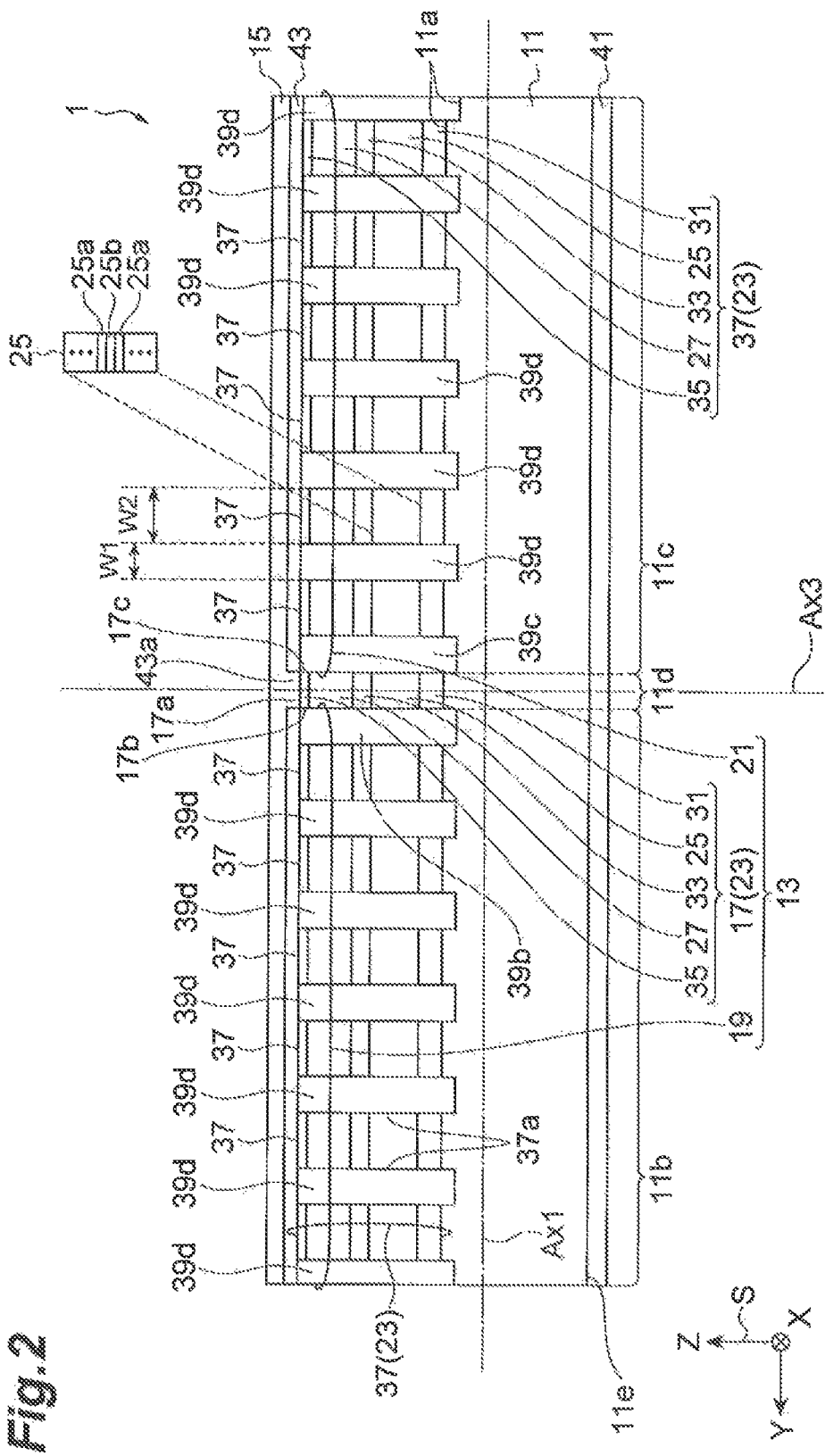
FIG. 2 is a schematic cross sectional view, taken along line I-I in FIG. 1, showing the quantum cascade semiconductor laser.
Figure 3:
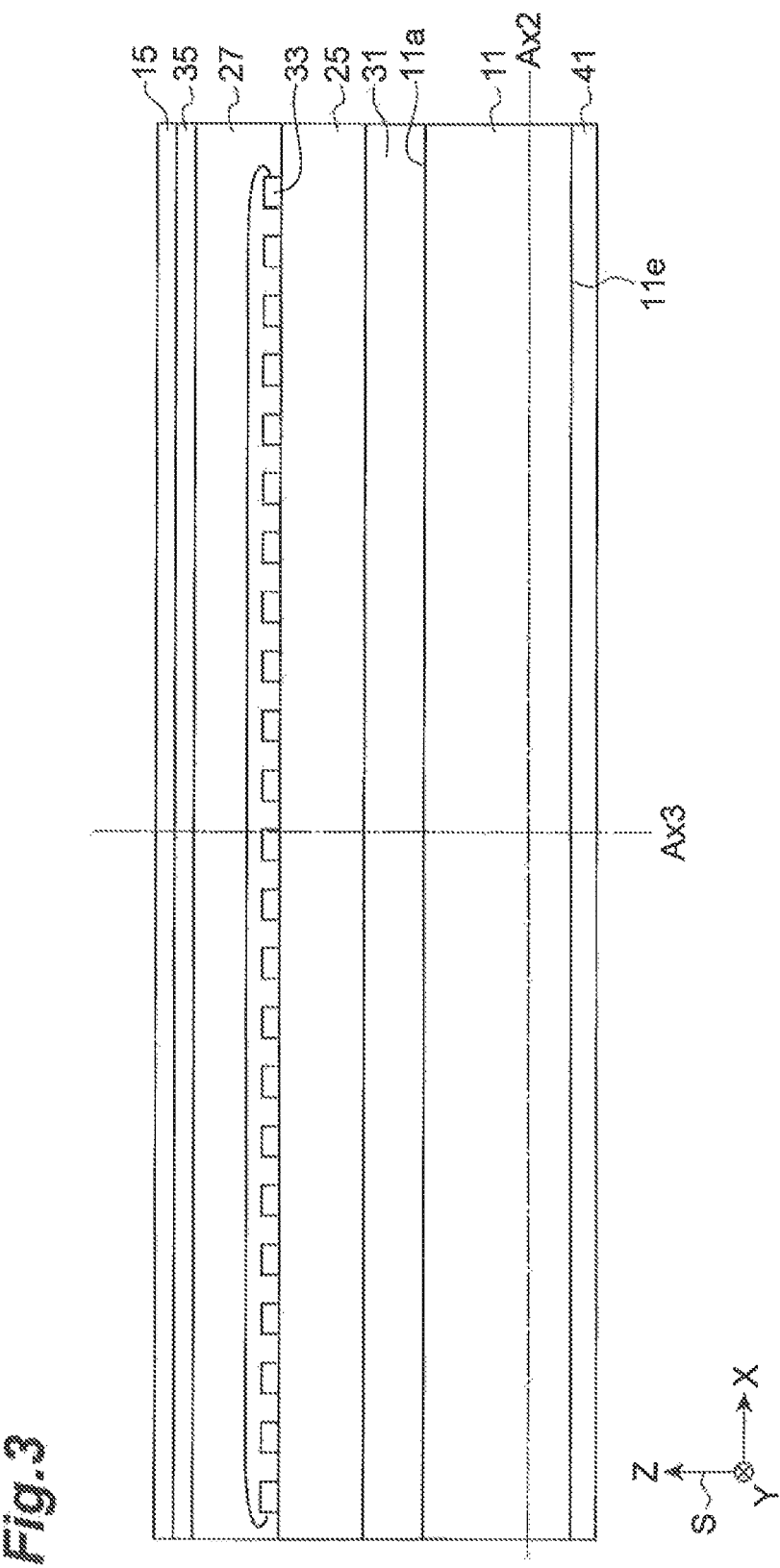
FIG. 3 is a schematic cross sectional view, taken along line III-III in FIG. 1, showing the quantum cascade semiconductor laser.

FIG. 1 is a plan view schematically showing a quantum cascade semiconductor laser. FIG. 2 is a schematic cross sectional view, taken along line I-I in FIG. 1, showing the quantum cascade semiconductor laser. FIG. 3 is a schematic cross sectional view, taken along line III-III in FIG. 1, showing the quantum cascade semiconductor laser. An orthogonal coordinate system S is depicted in FIGS. 1, 2, and 3. A quantum cascade semiconductor laser 1 includes a substrate 11, a semiconductor region 13, and an upper electrode 15. The substrate 11 can include, for example, a substrate, and the material of the substrate may be InP. The substrate 11 includes a first region 11b, a second region 11c, and a third region 11d. The first region 11b, the second region 11c, and the third region 11d are arranged along a first axis Ax1 (for example, the Y axis of the orthogonal coordinate system S). The third region 11d is provided between the first region 11b and the second region 11c.

The quantum cascade semiconductor laser 1 includes a pair of side edges 3a and 3b extending in the direction of the first axis Ax1, and a pair of end faces 3c and 3d extending in the direction of a second axis Ax2 (for example, the X axis of the orthogonal coordinate system S), which intersects the first axis Ax1.

The semiconductor region 13 includes a mesa waveguide 17 and is provided on a principal surface 11a of the substrate 11. The upper electrode 15 is provided on the semiconductor region 13 and is connected to the mesa waveguide 17. An upper surface 17a of the mesa waveguide 17 is in ohmic contact with the upper electrode 15. The mesa waveguide 17 is provided on the principal surface 11a of the third region 11d of the substrate 11. The mesa waveguide 17 includes a first side surface 17b and a second side surface 17c which extend in a direction from the end face 3c toward the end face 3d, such as the direction of the second axis Ax2. The mesa waveguide 17 has a semiconductor laminate structure 23, which includes a first semiconductor layer 25 and a second semiconductor layer 27. The first semiconductor layer 25 serves as a core layer and the second semiconductor layer 27 serves as an upper cladding layer in the embodiment. In the present embodiment, the semiconductor laminate structure 23 may include a third semiconductor layer 31 for a lower cladding layer, a fourth semiconductor layer 33 for constructing diffraction grating for distributed feedback, and a fifth semiconductor layer 35 for a contact layer. The third semiconductor layer 31 (for example, a lower cladding layer), the first semiconductor layer 25 (for example, a core layer for quantum cascade), the fourth semiconductor layer 33 (for example, a diffraction grating layer), a second semiconductor layer 27 (for example, an upper cladding layer), and the fifth semiconductor layer 35 (for example, a contact layer) are stacked in a direction of a third axis Ax3 (the Z axis of the orthogonal coordinate system S) which intersects the first axis Ax1 and the second axis Ax2. Referring to FIG. 3, the fourth semiconductor layer 33 (for example, a diffraction grating layer) is patterned, and the diffraction grating layer extends along a waveguide axis in the direction of the second axis Ax2. The semiconductor region 13 includes a first burying region 19 and a second burying region 21 which bury the mesa waveguide 17 for current blocking and current confinement. The first burying region 19 is provided on the first side surface 17b of the mesa waveguide 17 and the first region 11b of the substrate 11, and the second burying region 21 is provided on the second side surface 17c of the mesa waveguide 17 and the second region 11c of the substrate 11.

Each of the first burying region 19 and the second burying region 21 includes laminate regions 37 and a bulk semiconductor region 39. The laminate regions 37 are arranged on the first region 11b and the second region 11c so as to be separated from each other by the bulk semiconductor region 39. Each of the laminate regions 37 has a semiconductor laminate structure 23. The bulk semiconductor region 39 is provided on the first region 11b, the second region 11c, and side surfaces 37a of the laminate region 37 so as to embed the laminate regions 37. The bulk semiconductor region 39 includes a first confining section 39b, a second confining section 39c, and the remaining bulk portion other than the first confining section 39b and the second confining section 39c. The first and second confining sections 39b and 39c among these sections are in contact with the first and second side surfaces 17b and 17c of the mesa waveguide 17, respectively, and function as current blocking layers which confine current to the mesa waveguide 17. The bulk semiconductor region 39 is constituted by a semiconductor material with very low light absorption in a wavelength region of a lasing light of the quantum cascade semiconductor laser, and does not include any fine structures, such as quantum wells and superlattices. For example, the bulk semiconductor region 39 may be made of a single semiconductor material. As described above, the bulk semiconductor region 39 includes the first confining section 39b and the second confining section 39c which are in contact with the first side surface 17b and the second side surface 17c of the mesa waveguide 17, respectively.

In the quantum cascade semiconductor laser 1, the first burying region 19 and the second burying region 21 each include laminate regions 37, and the laminate regions 37 are provided in each of the first region 11b and the second region 11c. Each of the laminate regions 37 and the mesa waveguide 17 includes the semiconductor laminate structure 23. The laminate regions 37 include the semiconductor laminate structures 23 each of which is the same as that of the mesa waveguide 17, so that the laminate regions 37 and the mesa waveguide 17 constitute an arrangement of semiconductor laminate structures 23, which are separated from each other. The bulk semiconductor region 39 is provided between the laminate regions 37 and the mesa waveguide 17 that are separated from each other, and accordingly can electrically separate the mesa waveguide 17 from each of the laminate regions 37. The laminate regions do not disturb the confinement of current to the mesa waveguide.

The laminate regions 37 can be formed along with the mesa waveguide 17 in the etching to form the mesa waveguide 17. The application of the laminate regions 37 to the first burying region 19 on the first region 11b and to the second burying region 21 on the second region 11c allows the bulk semiconductor region 39 to fill only the region formed by removal in the etching of forming the mesa waveguide 17 and the laminate regions 37, so that the etching removes semiconductor on a smaller area per one device section, as compared to a structure formed by a fabricating process to remove a semiconductor laminate over the entire first and second regions 11b and 11c by etching. The reduction in etching area increases the etching rate. Such an increase in etching rate enables the mesa waveguide 17 of high-mesa, which is desired in a quantum cascade laser, to be formed more readily by etching.

In addition, in the first burying region 19 and the second burying region 21 which include an array of the laminate regions 37, the bulk semiconductor region 39 that buries the semiconductor laminate structures 23 of the laminate regions 37 is enclosed by the semiconductor laminate structure 23 in at least one of the direction of the first axis Ax1 or the direction of the second axis Ax2. The enclosure can prevent semiconductor for the bulk semiconductor region 39 from growing over a wide area in at least one of the direction of the first axis Ax1 or the direction of the second axis Ax2. Restrictions in shape and size of a growth area provide the bulk semiconductor region 39 with favorable flatness. In other words, the application of the laminate regions 37 to the first burying region 19 and the second burying region 21 provides the bulk semiconductor region 39, which is provided on the first region 11b and the second region 11c, with favorable flatness.

An example of the quantum cascade semiconductor laser 1 is as follows.
Substrate 11: n-type InP substrate.
First semiconductor layer 25 (core layer): structure in which active layers and injection layers are alternately arranged.
Active layer: superlattice structure of GaInAs/AlInAs.
Injection layer: superlattice structure of GaInAs/AlInAs.
Second semiconductor layer 27 (upper cladding layer): n-type InP.
Third semiconductor layer 31 (lower cladding layer): n-type InP.
Fourth semiconductor layer 33 (diffraction grating layer): undoped or n-type GaInAs.

Fifth semiconductor layer 35 (contact layer): n-type GaInAs.
Bulk semiconductor region 39: semi-insulating InP, undoped InP.

In a preferred example, the substrate 11 includes an n-type InP substrate. In the quantum cascade semiconductor laser 1, the semiconductor layers constituting the quantum cascade semiconductor laser 1 have respective lattice constants close to that of InP, so that the application of an InP substrate enables the layers to be grown with favorable crystalline quality. In addition, since the InP substrate is transparent to mid-infrared lasing light, InP of the substrate functions as a lower cladding layer.

Furthermore, the upper cladding layer that is provided by the second semiconductor layer 27 includes InP. In the quantum cascade semiconductor laser 1, InP is transparent to mid-infrared lasing light, and is suitable for material of a cladding layer. In addition, InP is a binary mixed crystal and a lattice thereof matches that of an InP substrate, and accordingly InP can be readily grown thereon. Furthermore, InP has a high thermal conductivity, and the upper cladding layer of InP allows favorable dissipation of heat from a core layer. Using the InP upper cladding layer can improve temperature characteristics of the quantum cascade semiconductor laser. The lower cladding layer may also include InP.

The core layer that is provided by the first semiconductor layer 25 includes active layers 25a for emitting light, and injection layers 25b for injecting a carrier into the respective active layers 25a. The active layers 25a and the injection layers 25b are alternately stacked. In the quantum cascade semiconductor laser 1, a cascade connection of the active layers 25a and the injection layers 25b is applicable to the core layer of the quantum cascade semiconductor laser 1. A stack of the active layers 25a, with the injection layers 25b being provided between the respective active layers 25a, allows electrons to continuously flow to an adjacent active layer 25a in a seamless manner, and enables electron transition between sub-bands of the conduction band, so that the quantum cascade semiconductor laser emits lasing light. The active layers 25a and the injection layers 25b are constituted by, for example, GaInAs/AlInAs superlattice structure. In the quantum cascade semiconductor laser 1, such a superlattice structure is capable of providing an optical transition between the sub-bands of the conduction band, corresponding to a wavelength in the mid-infrared region, so that the superlattice structure is suitable as a core layer for mid-infrared lasing.

The bulk semiconductor region 39 includes at least one of a semi-insulating semiconductor or an undoped semiconductor. These high-resistive materials enable the bulk semiconductor region 39 to favorably function as current blocking layers (39b and 39c) for confining current (carriers) into the mesa waveguide 17. In addition, due to a high resistance thereof, the bulk semiconductor region 39 provided apart from the side surfaces of the mesa waveguide 17 can impart higher resistivity to semiconductor regions outside of the mesa waveguide 17 to reduce a leakage current flowing outside the mesa waveguide.

More specifically, the bulk semiconductor region 39 includes a semi-insulating semiconductor. The semi-insulating semiconductor can be a semiconductor doped with a transition metal. The transition metal can be at least any one of Fe, Ti, Cr, or Co. In the quantum cascade semiconductor laser 1, these transition metals can provide III-V compound semiconductors, such as InP, GaInAs, AlInAs, GaInAsP, and AlGaInAs, with a semi-insulating property, which is sufficient high resistance to electrons, such as $10^5$ ($\Omega \cdot cm$) or higher. The addition of these transition metals is suitable for providing the bulk semiconductor region 39 with a high resistivity.

The quantum cascade semiconductor laser 1 can include a lower electrode 41 provided on a back surface 11e of the substrate 11. An isolation layer 43 for electric isolation is provided between the upper electrode 15 and the first and second burying regions 19 and 21. The insulation layer 43 includes an opening 43a positioned on the upper surface 17a of the mesa waveguide 17. The upper electrode 15 comes into contact with the upper surface 17a of the mesa waveguide 17 via the opening 43a.

At least one of a dielectric insulating film and a semiconductor capping layer that act as the isolation layer 43 can be provided between the upper electrode 15 and the first and second burying regions 19 and 21.

The quantum cascade semiconductor laser 1 can include a dielectric insulating film working as the insulation layer 43 between the upper electrode 15 and the first and second burying regions 19 and 21. Dielectric insulating films have durability and an insulating property which are suitable as the insulation layer 43 of the quantum cascade semiconductor laser 1. In addition, the dielectric insulating film can be readily formed using a general reactor for dielectric film deposition and, therefore, can be readily introduced into a manufacturing process. The dielectric insulating film can include, for example, at least any one of $SiO_2$, SiON, SiN, alumina, BCB resin, and polyimide resin. $SiO_2$, SiON, SiN, alumina, BCB resin, and polyimide resin among the dielectric insulating films have superior durability and a superior insulating property. In addition, films including these materials can be readily formed with a general reactor for dielectric film deposition and can be readily introduced into a manufacturing process.

The quantum cascade semiconductor laser 1 can include a semiconductor capping layer working as the insulation layer 43 between the upper electrode 15 and the first and second burying regions 19 and 21. The semiconductor capping layer favorably includes at least any of an undoped semiconductor or a semi-insulating semiconductor. The semiconductor capping layer constituted by a semi-insulating semiconductor and/or an undoped semiconductor has favorable thermal conductivity, and can improve flatness of the device surface, as compared to a dielectric insulating film. The application of the semiconductor capping layer enables high dissipation of heat from the device in mounting in an epi-down manner, and can makes it easy to prevent heat dissipation failure from deteriorating characteristics of the quantum cascade semiconductor laser. Specifically, the semiconductor capping layer can include a semi-insulating semiconductor. Preferably, the semi-insulating semiconductor is a transition metal-doped semiconductor, and the transition metal is at least any one of Fe, Ti, Cr, and Co. These transition metals allow III-V compound semiconductors, such as InP, GaInAs, AlInAs, GaInAsP, and AlGaInAs, to have a semi-insulating property. Doping these semiconductors with a transition metal preferably provides the semiconductor capping layer with high resistance. The transition metal-doped semiconductor has sufficient high resistance to electrons of, for example, $10^5$ ($\Omega \cdot cm$) or higher.

Structure examples of the first burying region 19 and the second burying region 21 will now be described below.

(Structure Example 1)

As shown in FIG. 1, in the first burying region 19, the bulk semiconductor region 39 can include the first bulk portion 39b (which also functions as the first confining section) and first bulk portions 39d. In the first burying region 19, the first bulk portions 39*d* and the laminate regions 37 are alternately arrayed in a direction from the mesa waveguide 17 toward the side edge 3*a* of the quantum cascade semiconductor laser 1. Specifically, the first confining section 39*b* (which acts as a current blocking layer) extends along the first side surface 17*b* of the mesa waveguide 17; the nearest laminate region 37 extends along the first confining section 39*b*; and the nearest first bulk portion 39*d* extends along the nearest laminate region 37. The first burying region 19 may include first bulk portions 39*d* and laminate regions 37, and the first bulk portions 39*d* and the laminate regions 37 are alternately arrayed in a direction of the first axis Ax1 in the first burying region 19. In the present example, the furthermost first bulk portion 39*d* appears on the side edge 3*a*. The first burying region 19 includes the first bulk portion (first confining section) 39*b*, and the first bulk portions 39*d* separated from each other by the laminate regions 37. The insulation layer 43 is provided between the laminate regions 37 and the upper electrode 15 to prevent the upper electrode 15 from being connected to the laminate regions 37. In the second burying region 21, the bulk semiconductor region 39 includes the first bulk portion 39*c* (which also functions as the second confining section) and first bulk portions 39*d*. In the second burying region 21, with the exception of the first confining section 39*b* being replaced with the second confining section 39*c*, the bulk semiconductor region 39 can also include the first bulk portions 39*d* arrayed in a similar manner to the first burying region 19 (however, in a direction from the mesa waveguide 17 toward the side edge 3*b*). In the first burying region 19 and the second burying region 21, the first confining section 39*b*, the second confining section 39*c*, and the first bulk portion 39*d* extend in the direction of the second axis Ax2 and are separated from each other by the mesa waveguide 17 or the laminate regions 37.

The structure according to the present example provides the quantum cascade semiconductor laser 1 with an improved flatness of the device surface, which makes an epi-down mounting with superior heat dissipation easy and accordingly can prevent heat dissipation failure from deteriorating characteristics of the quantum cascade semiconductor lasers, and allows for a significant increase in etching rate in forming the mesa waveguide. The increased etching rate allows a high mesa, which has been an obstacle in the fabrication of quantum cascade semiconductor lasers, to be readily formed by etching.

(Structure Example 2)

Figure 4:
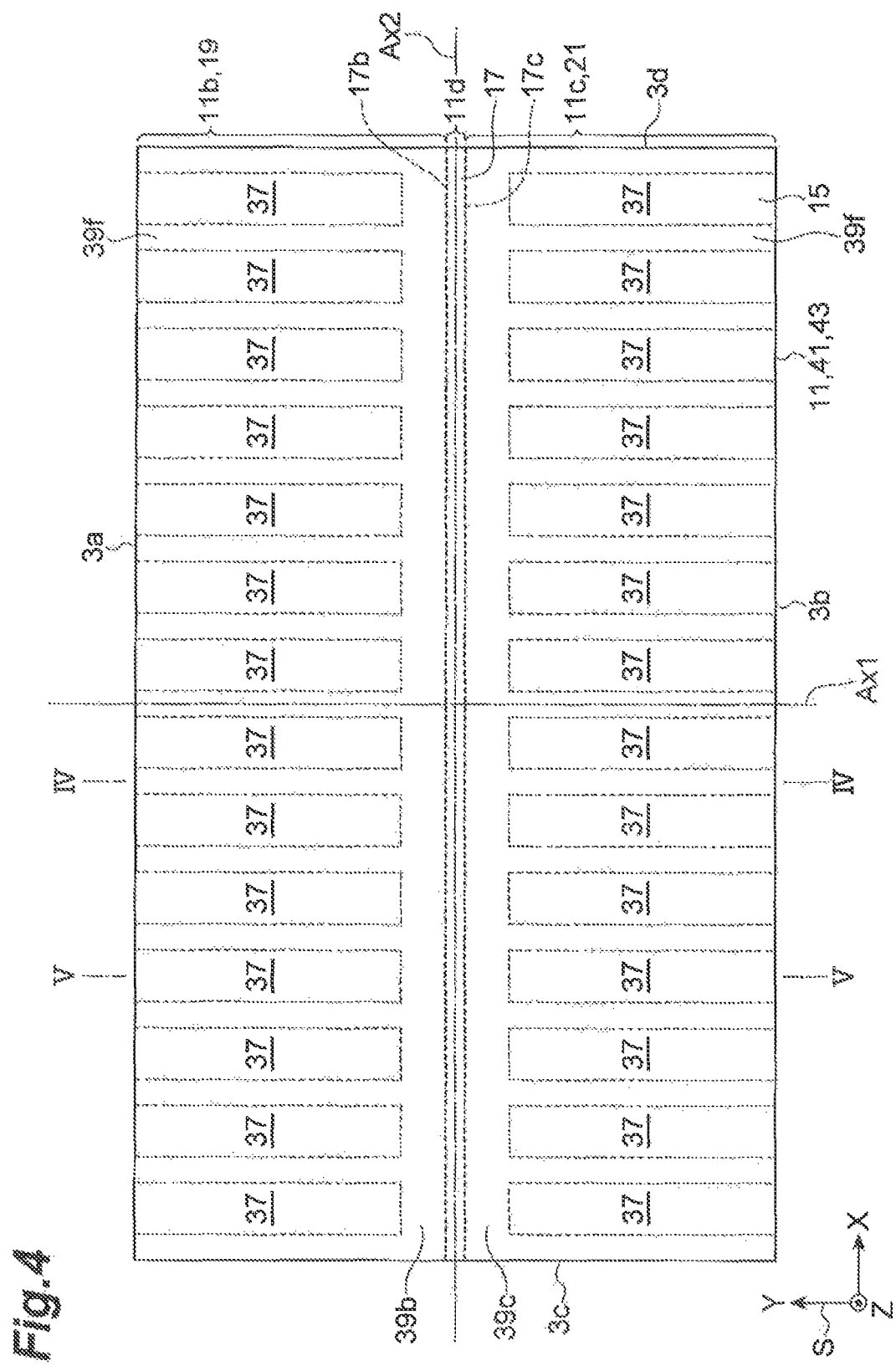
FIG. 4 is a schematic plan view showing a quantum cascade semiconductor laser according to the present embodiment.
Figure 5:
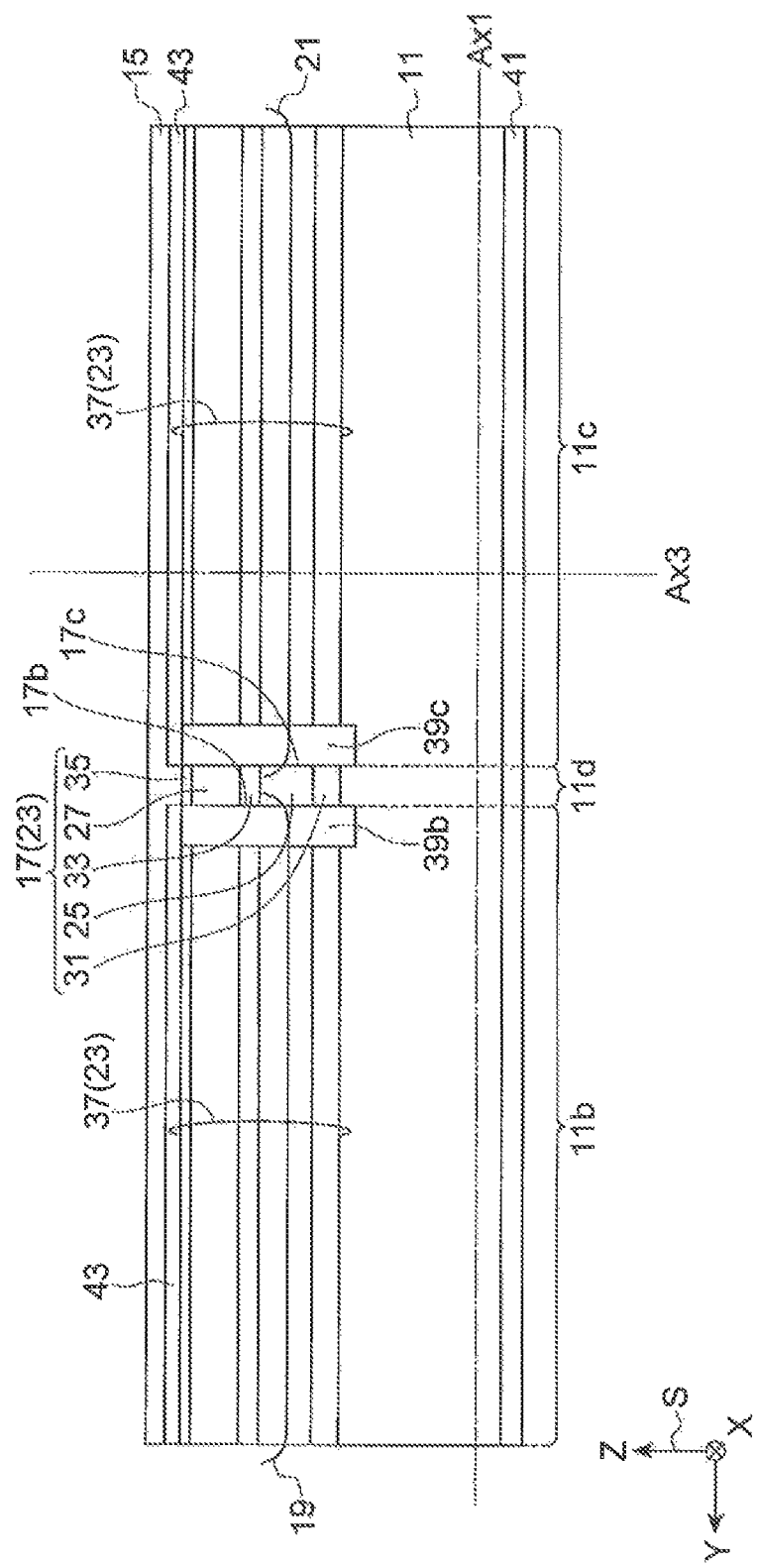
FIG. 5 is a schematic cross sectional view, taken along line V-V in FIG. 4, showing the quantum cascade semiconductor laser.
Figure 6:
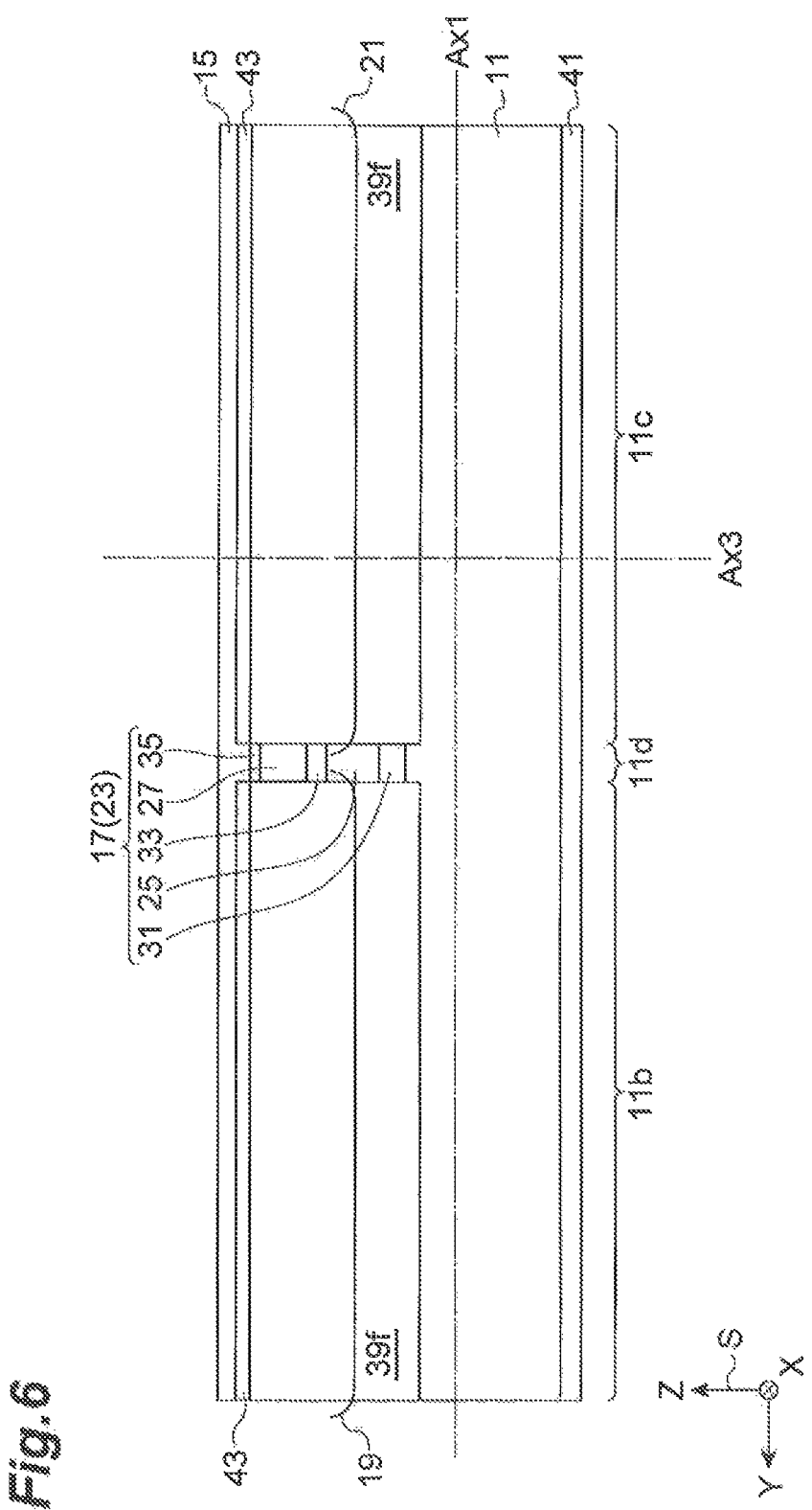
FIG. 6 is a schematic cross sectional view, taken along line VI-VI in FIG. 4, showing the quantum cascade semiconductor laser.

FIG. 4 is a plan view schematically showing a quantum cascade semiconductor laser. FIG. 5 is a schematic cross sectional view, taken along line V-V in FIG. 4, showing the quantum cascade semiconductor laser. FIG. 6 is a schematic cross sectional view, taken along line IV-IV in FIG. 4, showing the quantum cascade semiconductor laser. As shown in FIGS. 4 to 6, the bulk semiconductor region 39 can include second bulk portions 39*f* provided in each of the first burying region 19 and the second burying region 21. In the first burying region 19, the second bulk portions 39*f* and the laminate regions 37 are alternately arrayed in a direction from the end 3*c* toward the end 3*d* of the quantum cascade semiconductor laser 1. Specifically, the first confining section 39*b* extends along the first side surface 17*b* of the mesa waveguide 17. The second bulk portion 39*f* extends in a direction from the mesa waveguide 17 toward the side edge 3*a* of the quantum cascade semiconductor laser 1. One end of each of the second bulk portions 39*f* is connected to the first confining section 39*b* and another end of the second bulk portion 39*f* reaches the side edge 3*a* of the quantum cascade semiconductor laser 1. The laminate regions 37 in the first burying region 19 are separated by the second bulk portions 39*f*. The insulation layer 43 is provided between the laminate regions 37 and the upper electrode 15 to prevent the upper electrode 15 from being connected to the laminate regions 37. In the present example, the respective second bulk portions 39*f* appear on the end 3*c* and 3*d*. The first burying region 19 includes the first confining section 39*b* and the second bulk portions 39*f*. The first confining section 39*b* and the second bulk portions 39*f* separate all the laminate regions 37 from each other, and separate the mesa waveguide 17 from all the laminate regions 37. In addition, the second burying region 21 includes the second confining section 39*c* and the second bulk portions 39*f*. In the second burying region 21, with the exception of the first confining section 39*b* being replaced with the second confining section 39*c*, the bulk semiconductor region 39 can also include the second bulk portions 39*f* arrayed in a similar manner to the first burying region 19. The first confining section 39*b* and the second confining section 39*c* extend in the direction of the second axis Ax2 in the first burying region 19 and the second burying region 21, respectively, and electrically separate the mesa waveguide 17 from all laminate regions 37. This arrangement enables the confinement of current to the mesa waveguide 17 in a favorable manner. In addition, the second bulk portions 39*f* separate the laminate regions 37 arrayed in the direction of the first axis Ax1.

The structure according to structure example 2 can provide the quantum cascade semiconductor laser 1 with an improved flatness of the device surface, which makes an epi-down mounting with superior heat dissipation easy, and accordingly can prevent heat dissipation failure from deteriorating characteristics of the quantum cascade semiconductor laser and allows for a significant increase in etching rate in forming the mesa waveguide. The increased etching rate allows a high mesa, which has been an obstacle in the fabrication of quantum cascade semiconductor lasers, to be readily formed by etching. Furthermore, the quantum cascade semiconductor laser includes an end face (excluding an end face of the mesa waveguide) which is constituted by a high resistive bulk semiconductor region without containing aluminum (Al). Accordingly, the quantum cascade semiconductor laser can prevent the end face from being subjected to Al oxidation and reduce a leakage current in the end face. The quantum cascade semiconductor laser can demonstrate the reduction or the avoidance in deterioration attributable to the oxidation or the leakage current that are associated with the end face.

(Structure Example 3)

Figure 7:
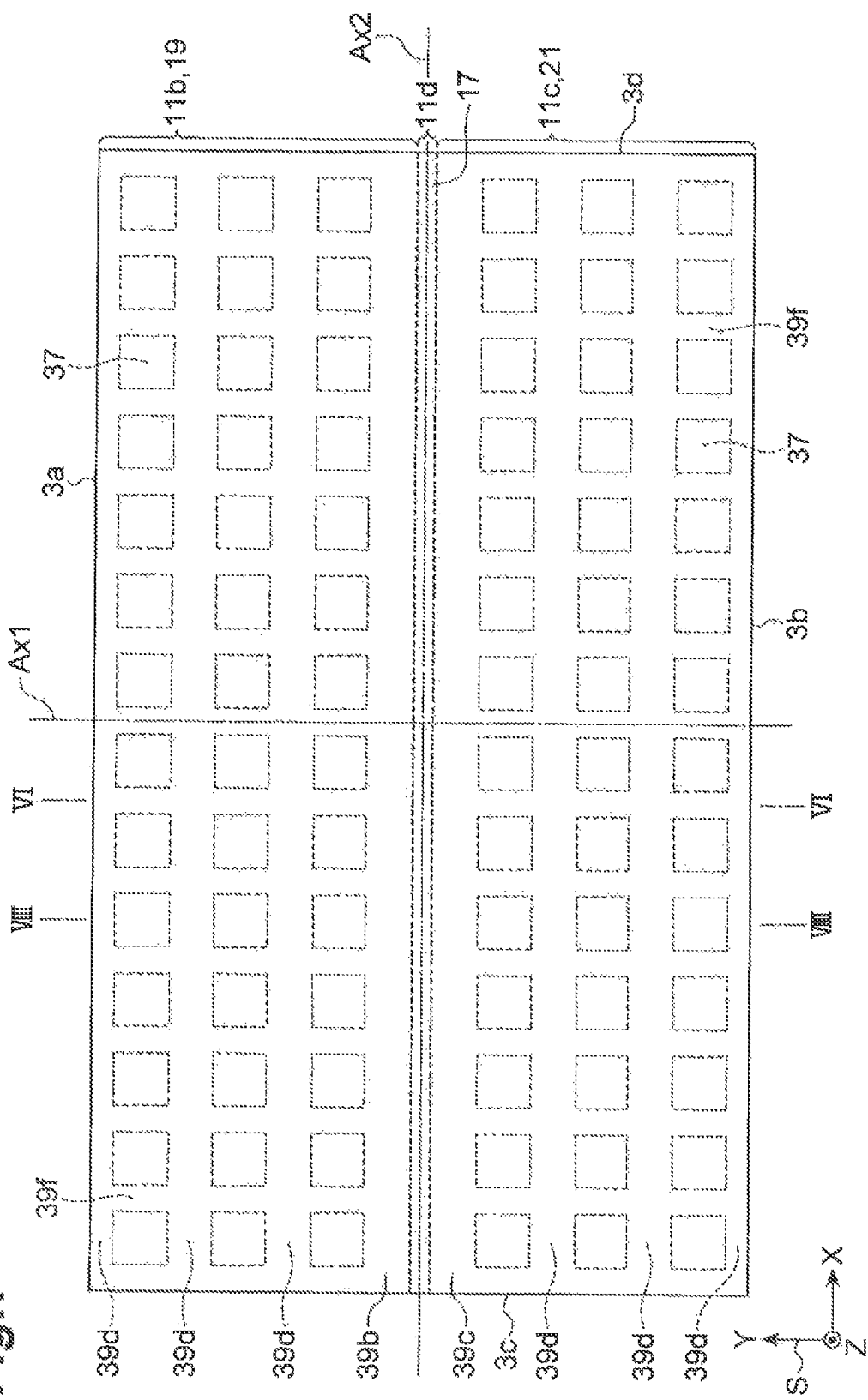
FIG. 7 is a schematic plan view showing a quantum cascade semiconductor laser according to the present embodiment.
Figure 8:
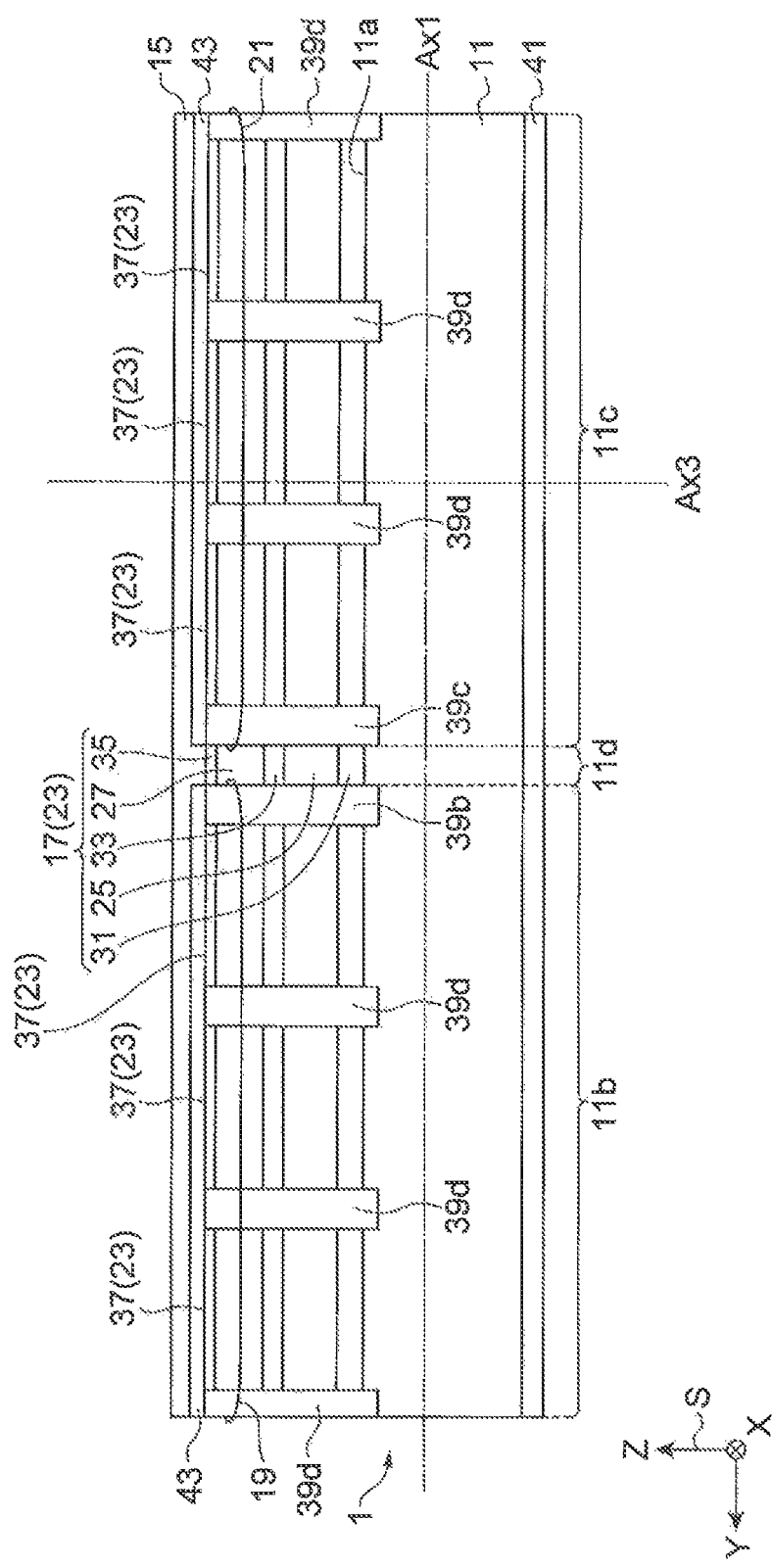
FIG. 8 is a schematic cross sectional view, taken along line VIII-VIII in FIG. 7, showing the quantum cascade semiconductor laser.
Figure 9:
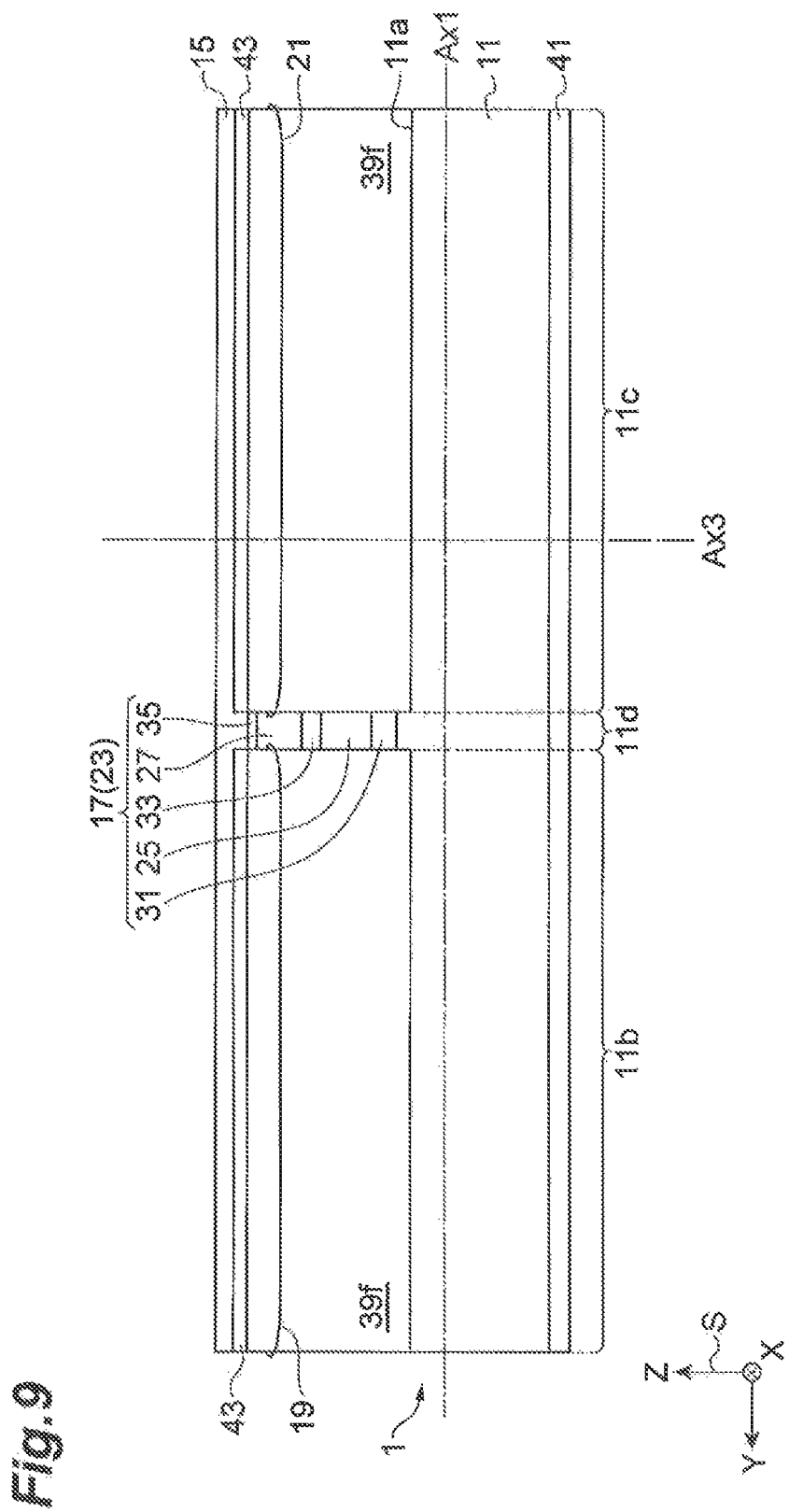
FIG. 9 is a schematic cross sectional view, taken along line IV-IV in FIG. 7, showing the quantum cascade semiconductor laser.

FIG. 7 is a schematic plan view showing a quantum cascade semiconductor laser. FIG. 8 is a schematic cross sectional view, taken along line VIII-VIII in FIG. 7, showing the quantum cascade semiconductor laser. FIG. 9 is a schematic cross sectional view, taken along line VI-VI in FIG. 7, showing the quantum cascade semiconductor laser. As shown in FIGS. 7 to 9, the bulk semiconductor region 39 includes the first bulk portion 39*b* (which also functions as the first confining section), first bulk portions 39*d*, and second bulk portions 39*f*, which are provided in the first burying region 19. In the first burying region 19, the first bulk portions 39*d* and the laminate regions 37 are alternately arrayed in a direction from the mesa waveguide 17 toward the side edge 3*a* of the quantum cascade semiconductor laser 1. In addition, the bulk semiconductor region 39 can include the second bulk portions 39*f* provided in the first burying region 19. In the first burying region 19, the second bulk portions 39*f* and the laminate regions 37 are alternately arrayed in a direction from the end 3*c* toward the end 3*d* of the quantum cascade semiconductor laser 1. The array of the first bulk portions 39*d* and the second bulk portions 39*f* forms grid-like sections. The laminate regions 37 are positioned in the respective sections to form an array thereof. Each of the laminate regions 37 is buried by the bulk semiconductor region 39. With the exception of the first confining section 39*b* being replaced with the second confining section 39*c*, the second burying region 21 has the same structure as the first burying region 19 described above. The array of the laminate regions 37 in each of the first burying region 19 and the second burying region 21 allows the stripe-shaped bulk semiconductor regions 39*f* to extend in the direction of the first axis Ax1 and the stripe-shaped bulk semiconductor regions 39*d* to extend in the direction of the second axis Ax2, thereby making flatness of the device surface improved. In addition, the device structure described above is applied to the first burying region 19 and the second burying region 21 to prevent the bulk semiconductor region 39 from extending for a long distance in both the direction of the first axis Ax1 and the direction of the second axis Ax2. In the present example, the respective first bulk portions 39*d* appear on the side edges 3*a* and 3*b*, and the respective second bulk portions 39*f* appear on the ends 3*c* and 3*d*.

The structure according to the present example provides the quantum cascade semiconductor laser 1 with an improved flatness of the device surface, which makes an epi-down mounting with superior heat dissipation easy, and accordingly can prevent heat dissipation failure from deteriorating characteristics of the quantum cascade semiconductor laser and allows for a significant increase in etching rate in forming the mesa waveguide. The increased etching rate allows a high mesa, which has been an obstacle in the fabrication of quantum cascade semiconductor lasers, to be readily formed by etching.

In the following examples, buried quantum cascade semiconductor lasers according to the present embodiment will be described.

First Example

In the example of the quantum cascade semiconductor laser 1 shown in FIG. 1, the mesa waveguide 17 is formed in a central region of the device, and the bulk semiconductor region 39 and the laminate regions 37 are alternately arrayed in a lateral direction (Y direction) over the entire area on both sides of the mesa waveguide 17.

The mesa waveguide 17 and the laminate regions 37 have a same layer structure. Specifically, an n-type lower cladding layer 31, a core (light-emitting) layer 25, a diffraction grating layer 33, an n-type upper cladding layer 27, and an n-type contact layer 35 are laminated on an n-type semiconductor substrate 11. An upper electrode 15 is formed on the device surface; a lower electrode 41 is formed on a back surface 11*e* of the substrate 11; and an insulating film 43 is provided between the upper electrode 15 and an underlying semiconductor in regions other than the mesa waveguide 17 in order to electrically insulate the upper electrode 15 and an underlying semiconductor layer from each other. Materials of components of a laser device according to the first example will be described in order.

An n-type InP substrate can be used as the substrate 11. Since semiconductor layers constituting a mid-infrared quantum cascade semiconductor laser are made of a semiconductor material with a lattice constant which is close to that of InP, the use of an InP substrate enables favorable crystals to be grown for the semiconductor layers. In addition, an InP substrate that is transparent with respect to mid-infrared oscillating light can also be used as a lower cladding layer. A substrate for a quantum cascade semiconductor laser favorably has conductivity in order to inject a current into a laser element using a back side electrode. In a quantum cascade semiconductor laser, since electrons are generally used as carriers, a conduction type of the substrate is favorably n-type.

n-type InP can be used as the upper cladding layer 27 and the lower cladding layer 31. InP, which is transparent to mid-infrared lasing light is favorably used as materials of the upper and lower cladding layers. In addition, the lattices of the upper and lower cladding layers made of InP match to a lattice of an InP substrate. Therefore, by growing binary mixed crystal InP on the InP substrate, the upper and lower cladding layers can be readily provided with favorable crystalline quality. Furthermore, since InP has highest thermal conductivity among semiconductor materials usable for a mid-infrared quantum cascade semiconductor laser, the cladding layer of InP enables heat from a core region during operation to be efficiently dissipated. As a result, the quantum cascade semiconductor laser can be provided with favorable heat dissipation, and temperature characteristics of the quantum cascade semiconductor laser can be improved.

The core layer 25 is formed of a superlattice. The core layer has a structure in which unit structures constituted by active layers 25*a* and injection layers 25*b* are stacked in a cascade at a period of several tens of the unit structures. Each of the active layers 25*a* and the injection layers 25*b* has a superlattice structure in which thin-film quantum well layers with a thickness of several nanometers and thin-film barrier layers with a thickness of several nanometers are alternately stacked, and the barrier layer has a higher bandgap energy than that of the quantum well layer.

With a quantum cascade semiconductor laser, only electrons are used as carriers to emit light through a transition of electrons between sub-bands in the conduction band thereof. In a quantum cascade semiconductor laser, mid-infrared light of 3 to 20 µm can be generated by appropriately setting a transition energy between sub-bands of the conduction band formed by adjusting material compositions and film thickness values of the quantum well layer and the barrier layer that constitute the active layer. As materials suitable for emitting mid-infrared light, GaInAs can be applied to the quantum well layer and AlInAs can be applied to the barrier layer.

On the other hand, for example, a semiconductor laser with a p-n junction for optical communications uses an inter-band electron transition between a conduction band and a valence band. In other words, light is generated by the transition energy that is released when electrons of the conduction band are recombined with holes in the valence band. A semiconductor laser provided with a p-n junction emits light according to a light generation mechanism different from that of a quantum cascade semiconductor laser.

The quantum cascade semiconductor laser 1 can include the diffraction grating layer 33 that enables favorable single mode lasing. The performance of the diffraction grating layer 33 is represented by a coupling coefficient indicating a magnitude of coupling between forward-propagating light and backward-propagating light in an optical cavity. A diffraction grating with a large coupling coefficient is desirable for providing a distributed feedback quantum cascade semiconductor laser with a favorable single mode lasing. As a material of the diffraction grating layer 33 described above, a semiconductor with a high refractive index which is effective in providing a large coupling coefficient, such as undoped GaInAs or n-type GaInAs, is favorably used.

When necessary, light confining regions for enhancing confinement of propagating light to the core layer 25 can be added to the quantum cascade semiconductor laser 1 on upper and lower sides of the core layer 25. In order to enhance the confinement of propagating light to the core layer 25, the light confining regions desirably have a high refractive index and are made of a material lattice-matching to an InP substrate. Such a material may be, for example, undoped GaInAs or n-type GaInAs which is usable for the diffraction grating layer 33.

When necessary, the contact layer 35 is used to form favorable ohmic contact with the upper electrode 15. In order to form favorable ohmic contact, the contact layer 35 is desirably made of a material which has a small bandgap and which is capable of lattice matching to an InP substrate. For example, the contact layer 35 can include n-type GaInAs. The lower electrode forms favorable ohmic contact with a back surface of the InP substrate. For example, the upper electrode 15 and the lower electrode 41 can include Ti/Au or Ge/Ni.

If possible, the quantum cascade semiconductor laser 1 may have a favorable ohmic contact without the contact layer 35. In addition, when an InP substrate can be used as a lower cladding region, the quantum cascade semiconductor laser 1 may not include the lower cladding layer 31. An n-type dopant for semiconductors can be Si, S, Sn, Se, and the like.

The bulk semiconductor region 39 is constituted by an undoped semiconductor and/or a semi-insulating semiconductor. These semiconductors have a high resistance to electrons acting as carriers, and are suitable as materials of the bulk semiconductor region 39. The use of the undoped semiconductor and/or the semi-insulating semiconductor enables the bulk semiconductor regions 39b and 39c (which act as current blocking layers), which bury the mesa waveguide 17 in contact with the mesa waveguide 17, to favorably function as layers for constricting current (carriers) to the mesa waveguide. In addition, the bulk semiconductor region 39d provided apart from the mesa waveguide 17 can impart high resistance to a semiconductor region apart from the mesa waveguide 17. The above structures can reduce a leakage current flowing through the burying regions 19 and 21 outside of the mesa waveguide 17.

The laminate regions 37 buried by the bulk semiconductor region 39 are constituted by the same semiconductor layers as the mesa waveguide 17.

A semi-insulating semiconductor can be used for the bulk semiconductor region 39. A semi-insulating property of the semiconductor is provided by, for example, a transition metal such as Fe, Ti, Cr, and Co added to the semiconductor to form deep levels for trapping electrons in a forbidden band. Semiconductor for this purpose may be a semiconductor compound, such as InP and AlInAs. In particular, iron (Fe) is suitable as dopant. Adding these transition metals to III-V compound semiconductors, such as InP and AlInAs, enables sufficient high resistance characteristics to electrons, such as $10^5$ ($\Omega \cdot cm$) or higher, leading to a semi-insulating property. Semi-insulating semiconductor layers favorably function as a bulk semiconductor region. An undoped semiconductor with sufficient high-resistive characteristics is also usable as the bulk semiconductor region. Specific examples of undoped or semi-insulating III-V compound semiconductors include InP, GaInAs, AlInAs, GaInAsP, and AlGaInAs. These semiconductors have lattices-matching with that of an InP substrate and can be grown with a growth reactor for molecular beam epitaxy, organic metal vapor phase growth, and the like.

Another advantage is that undoped and semi-insulating semiconductors contain very small amount of free carriers that exhibit light absorption in the mid-infrared region. These semiconductors have little absorption of mid-infrared light arising from free carriers therein. Applying an undoped semiconductor or a semi-insulating semiconductor to at least one portion of the bulk semiconductor region 39 can effectively suppress free carrier absorption to provide the quantum cascade semiconductor laser 1 with favorable oscillation characteristics. Furthermore, the undoped semiconductors and semi-insulating semiconductors also have high thermal conductivity. The bulk semiconductor region 39 to which these semiconductors are applied contribute to improving heat dissipation of the device, and enables the quantum cascade semiconductor laser 1 to operate at high temperatures. In particular, InP has highest thermal conductivity among semiconductor materials usable for a mid-infrared quantum cascade semiconductor laser and can provide the quantum cascade semiconductor laser 1 with high heat dissipation. Furthermore, InP is a binary mixed crystal, and the crystals can be readily grown on an InP substrate. InP can be used as undoped semiconductor or semi-insulating semiconductor layer favorably. Other semiconductors such as AlInAs may be used. AlInAs has a higher bandgap than InP. When AlInAs is applied to the bulk semiconductor regions 39b and 39c (current blocking layers) which are in contact with the mesa waveguide 17, the energy discontinuity at conduction band edges between AlInAs of the bulk semiconductor regions 39b and 39c and the respective layers constituting the mesa waveguide 17 is greater than energy discontinuity at the conduction band edges between InP and the respective layers constituting the mesa waveguide 17. Accordingly, an energy barrier to electrons further increases at an interface between the mesa waveguide 17 and the current blocking layers 39b and 39c. In addition to the intrinsic high resistivity of the current blocking layers 39b and 39c, increase in the energy barrier can prevent electrons from flowing from the mesa waveguide 17 into the current blocking layers 39b and 39c. This prevention acts to further enhance high resistance of the current blocking layers 39b and 39c to electrons. This structure can constrict a current to the mesa waveguide 17 more strongly, and the quantum cascade semiconductor laser 1 can be provided with more favorable lasing characteristics.

In the first burying region 19 and the second burying region 21, the insulating film 43 for electrical insulation is provided between the upper electrode and the underlying semiconductor region. A dielectric film such as $SiO_2$, SiON, SiN, alumina ($Al_2O_3$), BCB resin, and polyimide resin can be used as the insulating film 43. These dielectric films have superior durability and a superior insulating property so that they can be used as a protective film of a semiconductor device. In addition, these dielectric films can be formed by a dielectric film forming method, such as sputtering, chemical vapor deposition, and spin coating, and accordingly can be readily introduced into a manufacturing process.

In the structure according to the present example, the bulk semiconductor region 39 and the laminate regions 37 are alternately arrayed over the entire area in directions from the mesa waveguide 17 to the side edges 3a and 3b. The mesa waveguide 17 functions as a light-emitting region, and has the same semiconductor laminate structure 23 as the laminate regions 37.

This laminate structure is fabricated as follows. Semiconductor layers for a semiconductor laminate from the lower cladding layer 31 to the contact layer 35 are grown over an entire semiconductor substrate. A dielectric mask is formed on the semiconductor laminate. The dielectric film for the mask can be, for example, SiN or $SiO_2$. The mask has a pattern corresponding to the mesa waveguide 17 and the laminate regions 37. By etching the semiconductor laminate with this mask, the mesa waveguide 17 and the laminate regions 37 are formed in a region protected by the mask, and void regions are formed in regions between the mesa waveguide 17 and the laminate region 37 and between the laminate regions 37 which are not protected by the mask. Next, regrowth of a bulk semiconductor layer, with the mask being left, causes growth of a bulk semiconductor to proceed only in the voids that are not protected by the mask, thereby forming the bulk semiconductor region 39. The area of the respective voids in which the bulk semiconductor is to grow is divided to form an arrangement of the laminate regions 37. The respective void sections have a common shape defined by the laminate regions 37 that are protected by the mask, and accordingly growth rates of the bulk semiconductor layer have approximately the same value at the respective void sections regardless of the positions of the voids. The bulk semiconductor thus grown has favorable uniformity in thickness over the entire device section. In an example, it is preferable that widths (a width W1 in FIG. 2) of voids in which the bulk semiconductors are to be grown be constant. The respective voids have the same shape, and uniformity of the growth rate of the bulk semiconductor is further improved at the respective voids, and the bulk semiconductor can be grown to have an approximately uniform thickness over the entire device section.

Figure 10A:
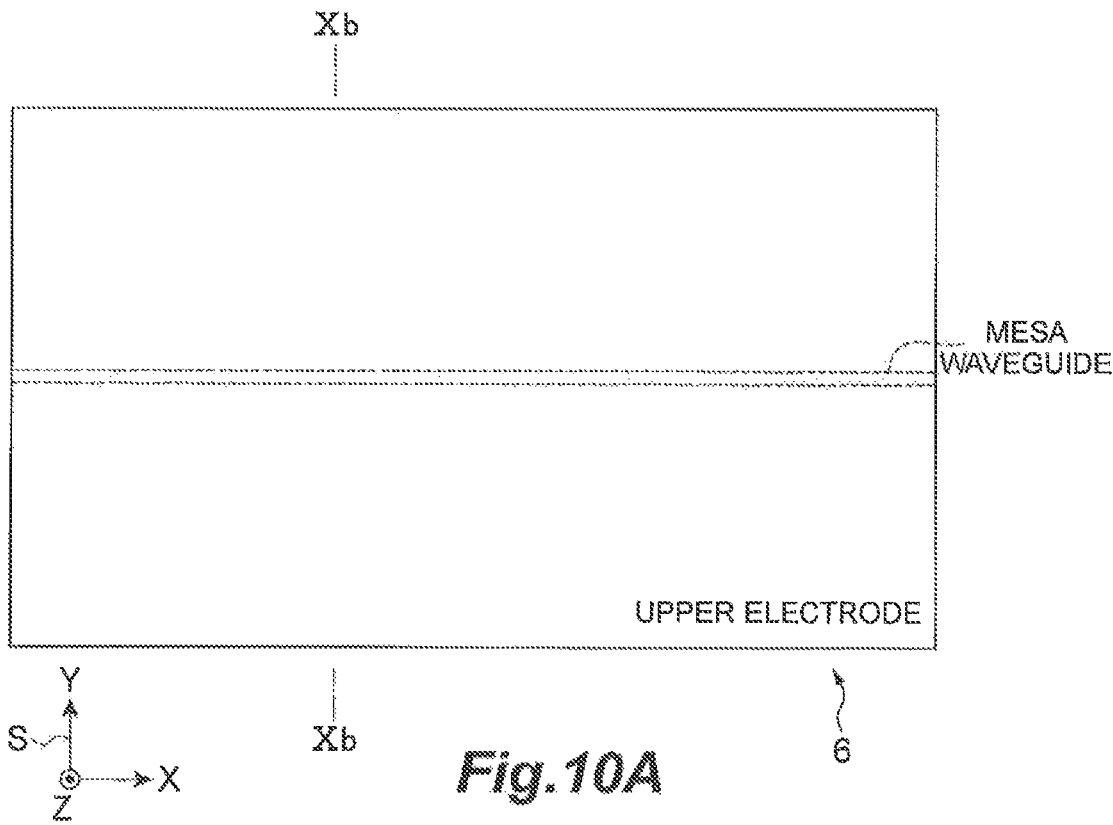
FIGS. 10A and 10B are schematic views showing a buried-heterostructure quantum cascade semiconductor laser having a mesa waveguide buried by a current blocking layer of a single material.
Figure 10B:
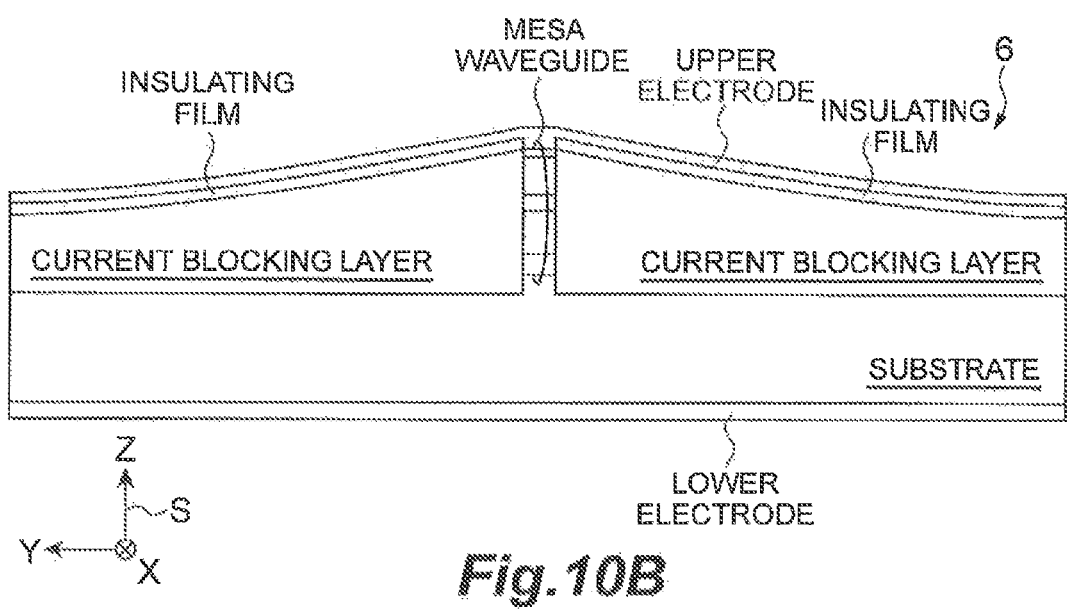

Problems with conventional buried-heterostructure quantum cascade lasers will now be described. FIGS. 10A and 10B are schematic diagrams showing a conventional quantum cascade semiconductor laser 6 of a buried heterostructure, and the quantum cascade semiconductor laser 6 includes a structure in which a mesa waveguide is buried by a current blocking layer constituted by a single material. FIG. 10A is a plan view showing the quantum cascade semiconductor laser 6, and FIG. 10B is a cross sectional view, taken along line Xb-Xb in FIG. 10A, showing the quantum cascade semiconductor laser 6. The quantum cascade semiconductor laser 6 includes a current blocking layer which is regrown with an apparatus for semiconductor crystal growth over a wide area positioned on both side surfaces of a mesa waveguide at the central thereof. This structure causes regrowth of a current blocking layer in an area in the vicinity of the mesa waveguide to have a higher growth rate due to the contributions of both growth on a principal surface of a substrate and growth on side surfaces of the mesa waveguide. In contrast, regrowth in an area apart from the side surfaces of the mesa waveguide along the principal surface of the substrate has a lower growth rate because of little contribution of the growth on the side surfaces of the mesa waveguide with distance away from the mesa waveguide. As shown in FIG. 10B, the current blocking layer thus grown has a thickness profile which decreases toward a device boundary apart from the mesa waveguide.

As seen from the description given above, the quantum cascade semiconductor laser 6 has a device surface with a poor flatness. Observations made by the present inventor shows that a difference between the thickness of the current blocking layer in an extreme vicinity of the mesa waveguide and the thickness of the current blocking layer in a vicinity of a device boundary apart from the mesa waveguide has a value of around 4 to 6 micrometers. Such a decline in flatness of the device surface makes mounting in an epi-down manner, which is effective in improving heat dissipation of a quantum cascade semiconductor laser, difficult, and in turn, makes reduction of deterioration of characteristics, caused by heat of the quantum cascade semiconductor laser difficult.

Figure 11:
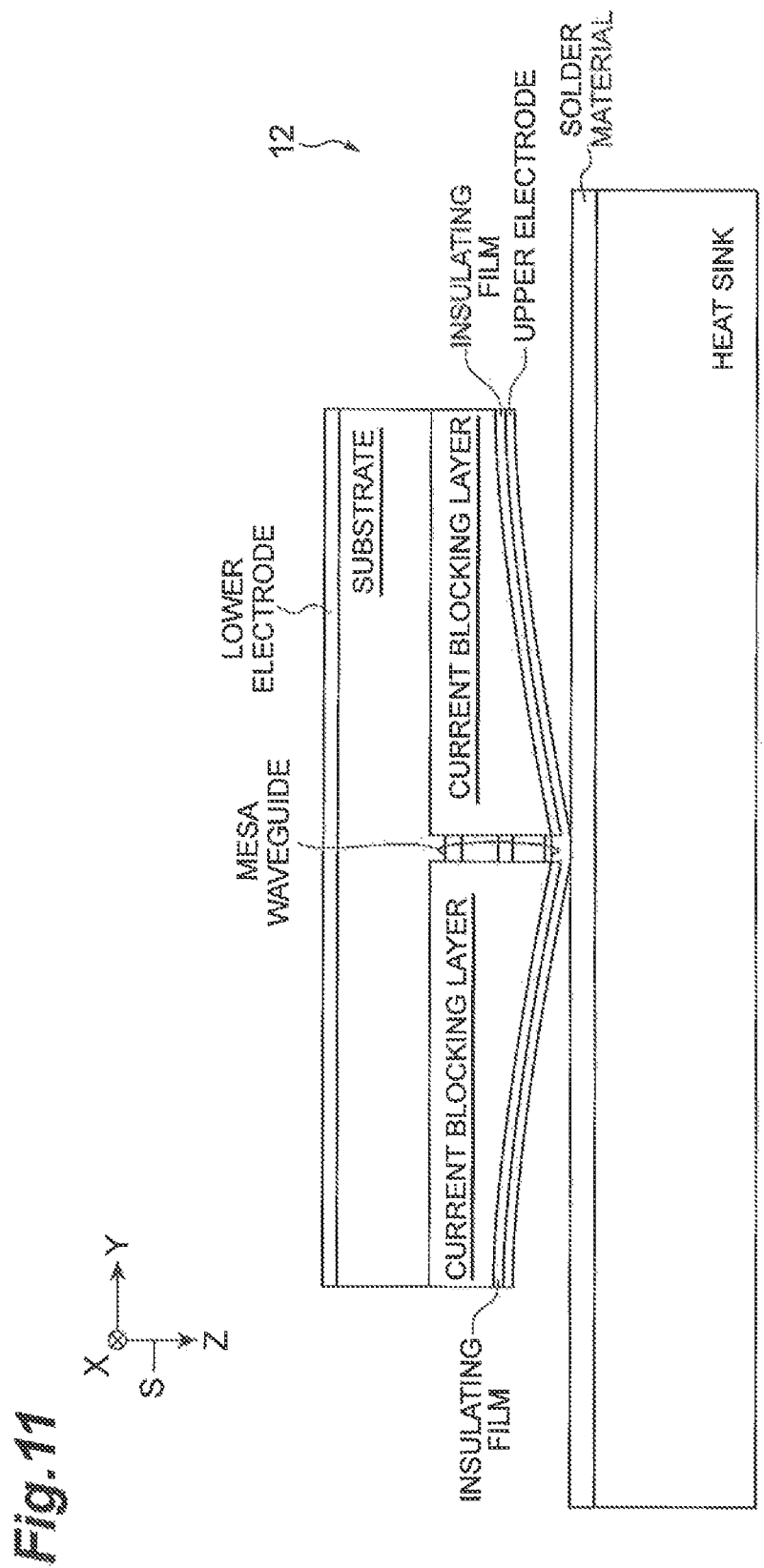
FIG. 11 is a schematic view showing an assembly in which the quantum cascade semiconductor laser shown in FIGS. 10A and 10B is mounted in an epi-down manner.

FIG. 11 is a schematic diagram showing the mounting of the quantum cascade semiconductor laser 6 shown in FIGS. 10A and 10B in an epi-down manner. As shown in FIG. 11, the quantum cascade semiconductor laser 6 is die-bonded in an epi-down manner. As indicated by the term "epi-down," an upper electrode on an epi layer is brought into contact with a heat sink, and the quantum cascade semiconductor laser 6 is die-bonded to the heat sink using a solder material. An assembly 12 is made by the mounting of the quantum cascade semiconductor laser 6. As shown in FIG. 11, with epi-down mounting, heat which the core layer generates during QCL operation can be transferred to the heat sink without passing through a thick substrate, and favorable heat dissipation is obtained in the device.

However, only the mesa waveguide protrudes therefrom to be highest in this device structure, and the whole load of the die-bonding process concentrates solely on the mesa waveguide during epi-down mounting. This gives the first problem as follows: the mesa waveguide is susceptible to mechanical damage and accordingly, device deterioration, such as lasing failure, is more likely to occur. In addition, in the structure of the assembly 12, the second problem is that only the upper electrode, which is in the vicinity of the mesa waveguide is die-bonded to the heat sink via the solder material, and paths for dissipating heat from the core layer to the heat sink during operation of the quantum cascade semiconductor laser are narrow, whereby favorable heat dissipation of an advantageous feature in epi-down mounting manners cannot be utilized. Therefore, it is difficult to prevent the deterioration of thermal characteristics of the quantum cascade semiconductor laser.

Figure 12:
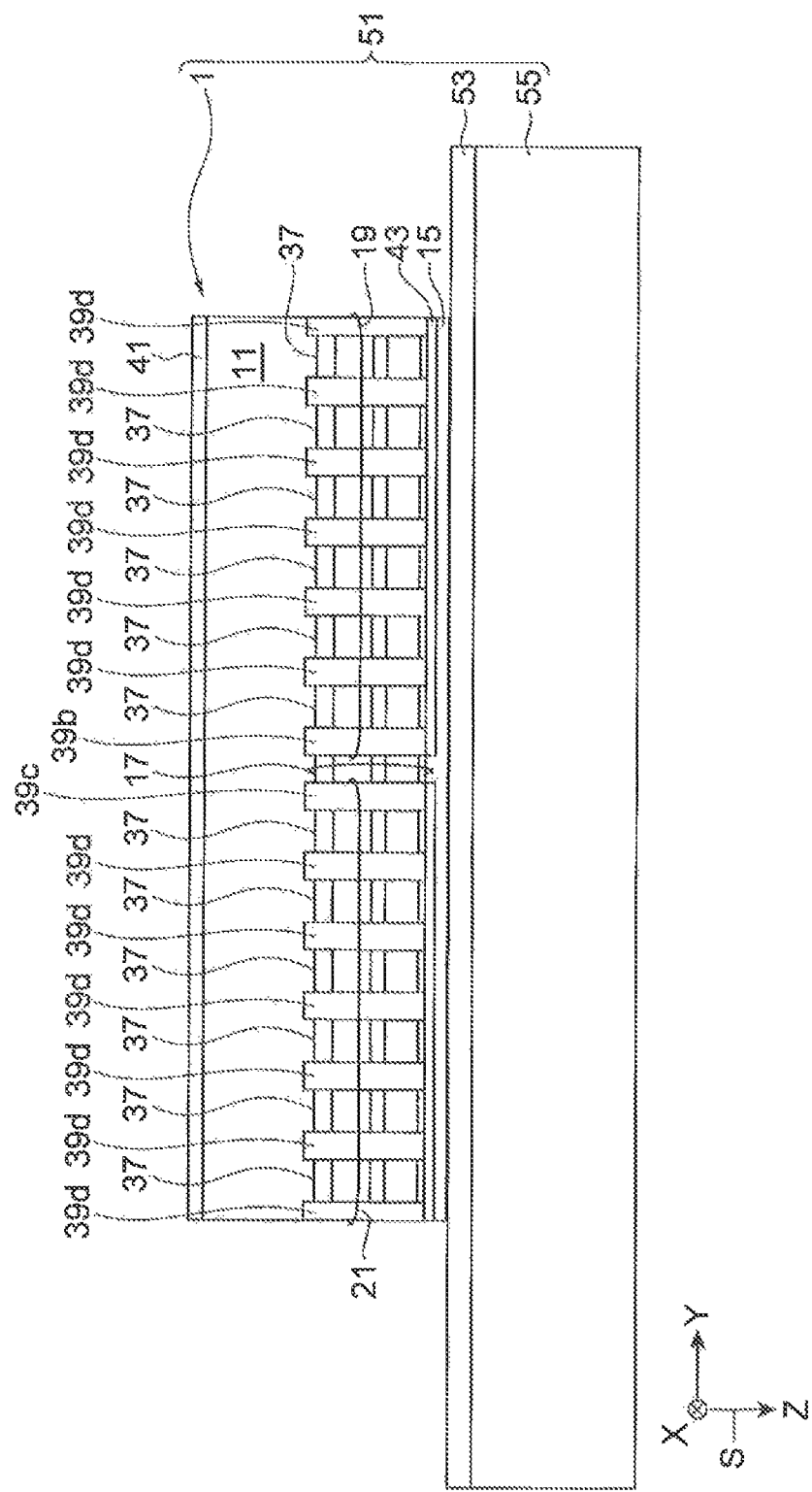
FIG. 12 is a schematic view showing an assembly in which the quantum cascade semiconductor laser according to the present embodiment is mounted in an epi-down manner.

FIG. 12 is a schematic diagram showing the mounting of the quantum cascade semiconductor laser 1, as shown in FIG. 1, in an epi-down form. In consideration of failures, such as those described above, in an assembly 51 in which the quantum cascade semiconductor laser 1 of the structure according to the present example is mounted in an epi-down form, the device surface is flat, and the upper electrode 15 on the first and second burying regions 19 and 21 which bury the mesa waveguide 17 are die-bonded to a heat sink 55 via a solder material 53 along with the upper electrode 15 on the central mesa waveguide 17. This assembly allows the load of the die-bonding to be applied not only to the mesa waveguide 17 but also to the entire device, thereby reducing the load, which is applied to the mesa waveguide 17 during die-bonding. The device structure according to the present example is capable of reducing structural damage to the mesa waveguide 17, as compared to the conventional device structure shown in FIG. 11, and can solve the first problem related to the epi-down mounting.

The laminate regions 37 (23) of the first burying region 19 and the second burying region 21 have the same height as the mesa waveguide 17, and accordingly, the laminate regions 37 act as struts in the first burying region 19 and the second burying region 21. The mesa waveguide 17 and the laminate regions 37 contribute to further distribution of the load that is applied to the device during mounting. In addition, the arrangement of the laminate regions 37 in the first burying region 19 and the second burying region 21 mainly act so as to make the thickness of the bulk semiconductor region 39 uniform over the entire device, and to provide the bulk semiconductor region 39 of a burying region with favorable surface flatness. The array of the laminate regions 37 described in the example is merely exemplary, and should not be restrictive. The device structure according to the present example is capable of providing favorable flatness of the device surface as described above, and the upper electrode 15 can be die-bonded to the heat sink 55 using the solder material 53 over the entire area of the device. Accordingly, heat dissipation from the device to the heat sink 55 can be significantly improved, leading to favorable heat dissipation that is inherent in epi-down mounting. This device can avoid deterioration in thermal characteristics, and accordingly the second problem related to epi-down mounting can be solved.

For example, a width (W1 shown in FIG. 2) of the bulk semiconductor region 39 is favorably 10 micrometers or more in order to avoid the occurrence of crystal deterioration, such as abnormal growth, and favorably 70 micrometers or less in order to obtain favorable flatness of the surfaces of the bulk semiconductor regions. Accordingly, deterioration in crystallinity of the bulk semiconductor does not occur, and the bulk semiconductor region thus grown has a surface with shallow depressions. The depressed portions of the device surface can be filled with a solder material during epi-down mounting, with voids not being left, thereby demonstrating favorable dissipation of heat in the device.

As an example, a width (W2 shown in FIG. 2) of the laminate regions 37 in the first burying region 19 and the second burying region 21 is favorably one micrometer or more, which allows for accurate processing with ordinary manufacturing techniques, such as photolithography and etching, and is favorably 50 micrometers or less in order to avoid deposition of polycrystalline material of the bulk semiconductor on the dielectric mask covering the laminate regions 37 during the burying regrowth of the bulk semiconductor region 39 which makes removal of the mask difficult.

Another problem associated with the conventional quantum cascade semiconductor laser 6 of a buried heterostructure is as follows. Propagating light spreads to the cladding layer and the substrate outside of the core layer because of a long lasing wavelength of a mid-infrared quantum cascade semiconductor laser, and in order to favorably confine such propagating light to the mesa waveguide, the mesa waveguide has to be provided with a high mesa structure, the height of which is around 5 to 10 micrometers. Such a waveguide with a high mesa structure is formed by growing a semiconductor laminate over the entire substrate, and then etching the semiconductor laminate. Etching gas is consumed over a wide area with a mask with a pattern defined so as to entirely remove the semiconductor laminate other than that for a narrow mesa waveguide, which is shown in FIG. 10B, with a width in the order of several μm defined in a lateral direction parallel to the principal surface of the substrate, and this pattern used in etching makes it difficult to increase the etching rate. The above processes make it difficult to perform mesa-etching for forming a mesa with a depth of 5 to 10 micrometers, which is necessary to form a mesa for a quantum cascade semiconductor laser in an actual fabrication process. This difficulty presents an obstacle in the fabrication of quantum cascade semiconductor laser.

In contrast, in the fabrication of the device structure according to the present example, the area that is to be etched during the formation of the mesa waveguide 17 is limited to a narrow area in which the bulk semiconductor region 39 is to be formed. The narrow etching area allows etching gas to be supplied to the limited etching region, thereby preventing the semiconductor laminate with the exception of the mesa waveguide 17 from being widely etched, and can increase the etching rate to a desired level. The enhancement of the etching rate that is attributable to the above device structure allows deep mesa etching with mesa heights of, for example, around 5 to 10 micrometers.

Second Example

In the first example, a dielectric insulating film for the isolation layer 43 is disposed between the upper electrode 15 and the laminate regions 37 and bulk semiconductor region 39 to provide electrical insulation to the first burying region 19 and the second burying region 21 which bury the mesa waveguide 17. In a second example, as shown in FIG. 1, a high-resistive semiconductor capping layer is disposed in place of the above dielectric insulating film, as the insulation layer 43. If necessary, a dielectric insulating film can be disposed in addition to a semiconductor capping layer. For example, a material of the high-resistive semiconductor capping layer can be made of a semi-insulating semiconductor or an undoped semiconductor usable for the bulk semiconductor region 39. In the second example, the bulk semiconductor regions 39 and the laminate regions 37 are similarly alternately arrayed in a direction (Y direction) that intersects the waveguide axis as shown in FIG. 1. This array allows for an improvement similar to that of the first example.

The semiconductor capping layer for the insulation layer 43 provides electrical isolation on the outside of the mesa waveguide 17, and provides favorable heat dissipation due to thermal conductivity exceeding that of a dielectric insulating film. In addition, the semiconductor capping layer can be grown so as to fill indentations which may be produced on a surface of the bulk semiconductor region 39 due to the array structure of the laminate regions 37 in the first burying region 19 and the second burying region 21 during the regrowth of the bulk semiconductor region 39. This increases the flatness of the surface of the device. The semiconductor capping layer working as the isolation layer 43 can further improve the flatness of the surface of the device, as compared to a device in which a dielectric insulating film is used.

As described above, with the structure according to the second example, the superior thermal conductivity of the semiconductor capping layer and a further improvement of the flatness of the device surface due to the capping layer enable the improvement of heat dissipation from a semiconductor chip of the quantum cascade semiconductor laser 1 mounted to a heat sink in the epi-down manner, as compared to the structure according to the first example. This reveals that the second problem related to epi-down mounting can be solved more readily.

Third Example

In the first and second examples, the bulk semiconductor regions 39 and the laminate region 37 are alternately arrayed over entire burying regions 19 and 21 of the device in a direction (Y direction) from the mesa waveguide 17 to the side edges 3a and 3b of the device. The direction of the array is not limited to these examples and, for example, an array can be configured as shown in FIG. 4. Stripe-shaped laminate regions 37 are disposed so as to extend in a direction from the mesa waveguide 17 toward the side edges 3a and 3*b* of the device, and bulk semiconductor sections 39*f* are provided between the laminate regions 37 so as to extend from the first confining section 39*b* and the second confining section 39*c*, which sandwich the mesa waveguide 17, to the side edges 3*a* and 3*b*.

In this array structure, high-resistive bulk semiconductor regions 39*b* and 39*c* acting as current blocking layers are formed on both side surfaces 17*b* and 17*c* of the mesa waveguide 17, respectively, and the insulation layer 43 electrically separates the upper electrode 15 connected to an upper surface of the mesa waveguide 17 from the laminate regions 37 and the bulk semiconductor region 39 in the first burying region 19 and the second burying region 21. This structure allows favorably confinement of current to the mesa waveguide 17.

The array structure in the first burying region 19 and the second burying region 21 contributes to improving flatness of the device surface, and enables the reduction of load which is to be applied to the mesa waveguide 17 during die bond mounting in an epi-down form. The present example has improvements related to epi-down mounting which are provided in a similar manner to the first example.

A novel advantage gained by the present example will be described. In the array structure according to the first and second examples, the mesa waveguide 17, the first burying region 19, and the second burying region 21 reach the ends 3*c* and 3*d* for an optical cavity. The semiconductor laminate regions (the laminate regions 37) that include several semiconductor layers with different compositions are exposed on ends of the first burying region 19 and the second burying region 21, and a semiconductor layer for the core layer 25 in each of the semiconductor laminate regions is constituted by a superlattice structure, and the barrier layer of the superlattice structure is provided with a semiconductor, such as AlInAs that includes aluminum as a constituent element. The semiconductor layer including aluminum is susceptible to oxidation, and impurities, such as oxidation products, are formed on the ends 3*c* and 3*d* for the optical cavity. In addition, crystal defects tend to proliferate because of oxidation. Such defects and impurities attributable to oxidation promote non-radiative recombination due to end face leakage current, device deterioration, such as an increase in threshold current and a decline in light output, tend to progress as oxidation at the end faces progresses. Such device deterioration results in a decline in electrostatic discharge (ESD) tolerance, and may cause sudden death of the semiconductor device.

In contrast, in the array structure according to the present example, as shown in FIG. 4, a semiconductor chip can be formed by cleaving such that the bulk semiconductor regions 39*f* constitute the end faces 3*c* and 3*d* in the first and second burying regions 19 and 21. This fabrication allows the bulk semiconductor regions 39*f* to constitute end faces of the optical cavity with the exception of end faces of the mesa waveguide 17. As seen from the examples described above, the bulk semiconductor regions 39*f* can be made of material, such as InP, that does not contain Al as a constituent element. This end facet structure can reduce surface oxidation attributable to a semiconductor layer including Al. In addition, the bulk semiconductor regions 39*f* have high resistance as described above, and accordingly the bulk semiconductor regions 39*f* contribute to reducing the end face leakage current. As understood from the description given above, compared to the array structure according to the first and second examples, the array structure according to the third example enables the reduction or avoidance in device deterioration attributable to end facet oxidation or an end facet leakage current.

Fourth Example

In the first to third examples, the bulk semiconductor regions 39 and the laminate regions 37 are alternately arrayed in any one of a direction in which a cavity extends, and a direction intersecting the direction in which the cavity extends. The array of the bulk semiconductor region 39 and the laminate regions 37 is not limited to these examples. As shown in FIG. 7, the bulk semiconductor regions 39 and the laminate regions 37 may be alternately arrayed in both directions in which the cavity extends and the direction intersecting the direction in which the cavity extends.

In the fourth example, the high-resistive bulk semiconductor regions 39*b* and 39*c* are similarly provided to form current blocking layers on the respective side surfaces of the mesa waveguide 17. In addition, the upper electrode 15 is provided on the burying regions 19 and 21 on the outside of the mesa waveguide 17 via the isolation layer 43, such as an insulating film for electrical insulation. This structure allows favorably confinement of current to the mesa waveguide 17.

In addition, in the fourth example, the bulk semiconductor regions 39 and the laminate regions 37 are alternately arrayed in the two directions. This structure can reduce load, which is applied to the mesa waveguide 17 during die-bonding by epi-down mounting, by deconcentration, and can provide the device surface with favorable flatness. The present example gains an improvement related to epi-down mounting in a similar manner to the first example. In addition, in fabricating a semiconductor chip, the bulk semiconductor regions 39*d* can be provided at the side edges 3*a* and 3*b*, whereas the bulk semiconductor regions 39*f* can be provided on the end faces 3*c* and 3*d* with the exception of the end faces of the mesa waveguide 17. This structure allows the reduction and avoidance in device deterioration attributable to end face oxidation in a similar manner to the third example.

In the present example, introducing the array structure in the two directions can increase a ratio of the area of the high-resistive bulk semiconductor region 39 to the total surface area of each of the first burying region 19 and the second burying region 21, and can provide regions other than the mesa waveguide 17 with higher resistivity. The present example allows the reduction in a leakage current flowing in the burying regions 19 and 21 in the outside of the mesa waveguide 17, and further improvement of characteristics of the quantum cascade semiconductor laser 1.

In the third and fourth examples, besides a dielectric insulating film, the high-resistive semiconductor capping layer described in the second example can be used as the isolation layer 43 for electrical insulation on the first burying region 19 and the second burying region 21 which bury the mesa waveguide 17.

While a DFB quantum cascade semiconductor laser with a diffraction grating layer has been described with reference to several examples, the embodiment is not limited thereto. For example, the quantum cascade semiconductor laser according to the embodiment can be applied in a similar manner to a Fabry-Perot (FP) quantum cascade semiconductor laser that does not include any diffraction grating layer, and the FP quantum cascade semiconductor laser can be provided with improvements similar to those made on the DFB quantum cascade semiconductor laser.

While the present embodiment has been described with reference to a quantum cascade semiconductor laser, the present embodiment is not limited to a quantum cascade semiconductor laser and is also applicable to, for example, a semiconductor laser with a p-n junction which is used for optical communications, and the semiconductor laser can obtain improvements similar to those made on quantum cascade semiconductor lasers.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A quantum cascade semiconductor laser comprising:
   a substrate including a first region, a second region, and a third region that are arranged along a first axis, the third region being provided between the first region and the second region; and
   a semiconductor region provided on a principal surface of the substrate, the semiconductor region including a mesa waveguide provided on the third region of the substrate, a first burying region provided on a first side surface of the mesa waveguide and the first region of the substrate, and a second burying region provided on a second side surface of the mesa waveguide and the second region of the substrate,
   wherein each of the first burying region and the second burying region includes a plurality of laminate regions and a plurality of bulk semiconductor regions that are alternately arrayed in a direction of the first axis,
   the laminate regions are separated from each other by the bulk semiconductor regions,
   the bulk semiconductor regions are provided on side surfaces of the laminate regions so as to embed the laminate regions, and
   each of the laminate regions includes a semiconductor laminate structure having a plurality of semiconductor layers.

2. The quantum cascade semiconductor laser according to claim 1,
   wherein the mesa waveguide includes a core layer and an upper cladding layer disposed on the core layer, and
   the semiconductor laminate structure of the laminate regions includes the core layer and the upper cladding layer.

3. The quantum cascade semiconductor laser according to claim 2,
   wherein the core layer includes active layers for emitting light and injection layers for injecting a carrier into the active layers, and
   the active layers and the injection layers are alternately stacked.

4. The quantum cascade semiconductor laser according to claim 1, wherein the bulk semiconductor regions include at least one of a semi-insulating semiconductor or an undoped semiconductor.

5. The quantum cascade semiconductor laser according to claim 1,
   wherein the bulk semiconductor regions include first bulk portions, and
   the first bulk portions and the laminate regions are alternately arrayed in the direction of the first axis.

6. The quantum cascade semiconductor laser according to claim 1,
   wherein the bulk semiconductor regions include second bulk portions, and
   the second bulk portions and the laminate regions are alternately arrayed in a direction of a second axis intersecting the first axis.

7. The quantum cascade semiconductor laser according to claim 1, further comprising:
   an upper electrode provided on the semiconductor region, the upper electrode being in contact with a top surface of the mesa waveguide; and
   a dielectric insulating film provided between the upper electrode and the first and second burying regions.

8. The quantum cascade semiconductor laser according to claim 7, wherein the dielectric insulating film is made of at least one of $SiO_2$, SiON, SiN, alumina, BCB resin, or polyimide resin.

9. The quantum cascade semiconductor laser according to claim 1, further comprising:
   an upper electrode provided on the semiconductor region, the upper electrode being in contact with a top surface of the mesa waveguide; and
   a semiconductor capping layer provided between the upper electrode and the first and second burying regions,
   wherein the semiconductor capping layer includes at least one of an undoped semiconductor layer or a semi-insulating semiconductor layer.

10. The quantum cascade semiconductor laser according to claim 9, wherein the semiconductor capping layer includes a semi-insulating semiconductor layer doped with a transition metal including at least one of Fe, Ti, Cr, or Co.

11. The quantum cascade semiconductor laser according to claim 1, wherein the bulk semiconductor regions include a semi-insulating semiconductor layer doped with a transition metal including at least one of Fe, Ti, Cr, or Co.

12. The quantum cascade semiconductor laser according to claim 2, wherein the upper cladding layer is made of InP.

13. The quantum cascade semiconductor laser according to claim 1, wherein the substrate is made of an n-type InP.

* * * * *